US007388785B2

(12) United States Patent
Furnémont

(10) Patent No.: US 7,388,785 B2
(45) Date of Patent: Jun. 17, 2008

(54) METHOD FOR EXTRACTING THE DISTRIBUTION OF CHARGE STORED IN A SEMICONDUCTOR DEVICE

(75) Inventor: Arnaud Adrien Furnémont, Philippeville (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 190 days.

(21) Appl. No.: 11/445,551

(22) Filed: Jun. 2, 2006

(65) Prior Publication Data

US 2006/0284082 A1    Dec. 21, 2006

Related U.S. Application Data

(60) Provisional application No. 60/704,859, filed on Aug. 1, 2005, provisional application No. 60/687,076, filed on Jun. 3, 2005.

(30) Foreign Application Priority Data

Oct. 14, 2005   (EP)   ................................. 05109600

(51) Int. Cl.
*G11C 11/34* (2006.01)
(52) U.S. Cl. .............................. 365/185.18; 365/185.19
(58) Field of Classification Search ........... 365/185.18, 365/185.19, 201
See application file for complete search history.

(56) References Cited

U.S. PATENT DOCUMENTS

| 5,583,811 | A | * | 12/1996 | Van Houdt et al. | ..... 365/185.15 |
| 6,552,387 | B1 | * | 4/2003 | Eitan | ........................... 257/324 |
| 7,151,692 | B2 | * | 12/2006 | Wu | ........................ 365/185.03 |
| 2006/0113586 | A1 | * | 6/2006 | Wang | ........................ 257/324 |

* cited by examiner

*Primary Examiner*—Anh Phung
(74) *Attorney, Agent, or Firm*—McDonnell Boehnen Hulbert & Berghoff LLP

(57) ABSTRACT

A method is described for extracting the spatial distribution of charge stored in a charge-trapping layer of a semiconductor device. The method comprises the steps of performing a first charge-pumping measurement on a device under test using a variation of the upper level of the pulse and performing a second charge-pumping measurement on this device using a variation of the lower level of the pulse. The data obtained is combined for extracting the spatial distribution. This is done by establishing a relation between a charge pumping current $I_{cp}$ and a calculated channel length $L_{calc}$ of the semiconductor device by reconstructing spatial charge distribution estimates from the charge pumping curves for multiple values of the charge pumping current $I_{cp}$. From these multiple values of $I_{cp}$ the value is obtained for which the corresponding calculated channel length $L_{calc}$ is substantially equal to the effective channel length $L_{eff}$ of the semiconductor device and the spatial charge distribution is reconstructed from the charge pumping curves using the obtained value of $I_{cp}$.

12 Claims, 16 Drawing Sheets

METHOD FOR EXTRACTING THE DISTRIBUTION OF CHARGE STORED IN A SEMICONDUCTOR DEVICE

This application claims the priority of European Patent Application No. 05109600 (filed Oct. 14, 2005) and Provisional U.S. Patent Application Nos. 60/687,076 (filed Jun. 3, 2005) and 60/704,859 (filed Aug. 1, 2005).

BACKGROUND

1. Technical Field

The present invention is in the field of semiconductor processing and devices, more specifically in the field of non-volatile charge-trapping memory devices. In particular, the present invention relates to a method for extracting the spatial distribution of charge stored in a charge-trapping layer of a semiconductor device, according to the preamble of the first claim.

2. Background Art

Non-volatile memories (NVM) are characterized by the fact that once a bit is stored in a memory cell this bit will be retained even when the memory cell is no longer powered. When electrical fields are used for erasing and programming of the memory cell, the NVM devices are also known as EEPROM (Electrically-Erasable-and-Programmable-Read-Only-Memory) devices. Whereas in floating gate EEPROM devices charge is stored in a conductive layer being part of a double-capacitor structure, in charge-trapping EEPROM devices charge is stored in a non-conductive layer being part of a single-capacitor structure. In such non-conductive charge-storage layer, e.g. nitride, oxide containing polysilicon nanocrystals or metal nanoparticles, the charge will not spread out uniformly over the whole of the charge-storage layer but will be confined substantially to the location where the charge was introduced into this non-conductive charge-storage layer. Charge-trapping memory devices are characterized by the presence of discrete charge traps as memory elements contrary to floating gate memory devices where a conductive layer is used as one continuous charge trap for storing charge. Developments in EEPROM devices are increasingly focused on localized charge trapping because it eases integration and reduces stress-induced-leakage. In particular NROM™ devices using nitride as non-conductive charge-storage layer as disclosed for example by B. Eitan in international application WO99/070000, are very attractive since they allow storage of two physical bits per memory cell, each bit at a different location in the nitride charge-storage layer. By injecting carriers, e.g. electrons, in the nitride layer the NROM™ cell is programmed. In order to erase the NROM™ cell opposite-type carriers are injected in the nitride layer as to compensate the charge stored during programming, e.g. holes are injected in the nitride layer to compensate the electrons already present. However, poor endurance and poor retention after cycling, i.e. repetitive programming and erasing of a cell, are major drawbacks of NROM™.

Currently the exact cause of the poor endurance and poor charge retention properties of non-volatile charge-trapping memory devices, in particular of NROM™ devices, is not yet known, impeding the improvement of these properties. One method to determine the lateral distribution of charge in MOSFET-type devices is the technique known as Charge-Pumping (CP). This method was initially developed to study hot-carrier-induced degradation mechanisms in MOSFET-type devices. Charge-pumping measurements are a powerful technique for obtaining information on the charge trapped in a MOSFET-type device by scanning the threshold voltage along the channel of the device. M. Rosmeulen et al teaches in "Characterization of the spatial charge distribution in local charge-trapping memory devices using the charge-pumping technique", (Solid-State Electronics journal, volume 48 (2004) p 1525-1530), the application of the charge-pumping technique to non-volatile memory devices which are based on localized trapping of charge, in particular to n-type NROM™ devices using nitride or silicon-rich-oxide as trapping medium and injection of electrons for programming the memory cell. In particular section 3.3 of this disclosure, hereby incorporated by reference in its entirety, teaches how the lateral distribution of the total charge trapped in the device can be directly calculated from the charge-pumping measurements using a deconvolution-based procedure. Although this measurement procedure allows extracting the lateral distribution of electrons injected in the device during a programming step, it doesn't take into account the variation of the density of charge traps present at the interface between the channel and the dielectric stack and assumes this density to be uniform along the channel. Moreover when the device is subjected to multiple program/erase steps, this interface will be degraded due to this electrical stress. Additional interface traps $N_{it}$ will be formed in a non-uniform way, in particular when erasing the memory device by injection of holes. Due to the sensitivity of the charge-pumping measurements to this interface degradation, an accurate extraction of the lateral distribution of charge injected in the trapping medium during a programming or erasing step in a degraded device is therefore impossible due the non-uniform distribution of the interface traps.

On the other hand Chim et al. describe in "Extraction of metal-oxide-semiconductor field-effect-transistor interface state and trapped charge spatial distributions using a physics-based algoritm" (Journal Applied Physics, volume 81(4) (1997), p 1993-2001) a charge extraction algorithm based on charge-pumping measurement data to gain insight in the hot-carrier-induced degradation mechanisms of MOSFETs and to extract both interface traps $N_{it}$ and oxide charge $N_{ot}$. However as this technique is based on an iteration scheme starting from values of interface traps, local threshold voltages etc, which are estimated in view of the expected results, its accuracy can be questioned.

Thus, there is a need for a method to determine the spatial distribution of charge trapped in a dielectric and in interface traps of a MOSFET-type device.

SUMMARY

A method is provided for determining the charge distribution in a non-volatile charge-trapping memory device.

This method extracts the spatial distribution of charge stored in a charge-trapping layer of a semiconductor device, which has a channel underneath the charge trapping layer with a given effective length $L_{eff}$. The method comprises the following steps. Two charge pumping curves are determined, one by using a varying base-level voltage measurement and the other by using a varying top-level voltage measurement in the charge-pumping technique. More particularly, the first curve is determined by a first charge-pumping measurement on the semiconductor device whereby only the upper level of the charge-pump pulse is varied and the second curve is determined by a second charge-pumping measurement on the semiconductor device whereby only the lower level of the charge-pump pulse is varied. The data from the first and second charge-pumping measurements is combined to obtain the spatial distribution of the charge in the charge-trapping layer.

This combining of the data from the curves is done as follows. A relation is established between a charge pumping current $I_{cp}$ and a calculated channel length $L_{calc}$ of the semiconductor device by reconstructing spatial charge distribution estimates from the charge pumping curves for multiple values of the charge pumping current $I_{cp}$. These values are preferably chosen in the upper range of the charge pumping curves, more preferably as close as possible to where one assumes the maximum charge pumping current $I_{cp\_max}$ to be, but this is not essential. From the multiple values of $I_{cp}$, that value is selected for which the corresponding calculated channel length $L_{calc}$ is substantially equal to the effective channel length $L_{eff}$ of the semiconductor device. Finally, the spatial charge distribution is reconstructed from the charge pumping curves using this value of $I_{cp}$.

By performing the varying base-level and the varying top-level charge pumping measurements, not only the spatial charge distribution of charge stored the charge-trapping layer can be extracted, but also the spatial charge distribution of charge stored in interface traps. In this way, the spatial distribution of both electrons and holes in the dielectric layer is obtained. The thus obtained hole and electron distribution curves are used for physical understanding and further optimisation of charge-trapping devices. In particular, the curves can be used to characterize the impact of electrical stress on charge retention characteristics of a non-volatile charge-trapping memory device in a more accurate and efficient way. The extraction method described herein allows extracting the distribution of the electrons and holes injected into the charge-trapping layer of the memory device and hence to determine the voltage settings required to obtain the selected charge distribution. By applying this extraction method one can extract not only the distribution of the electrons after a programming operation but also the distribution of holes after an erasing operation. This extraction is thus more accurate as the degradation of the interface states is taken into account.

In a preferred embodiment, the combining of data from the charge pumping curves comprises the following steps. First, one value as charge pumping current $I_{cp}$ is selected on one of the charge pumping profiles. Next, the calculated channel length $L_{calc}$ corresponding to the selected charge pumping current $I_{cp}$ is determined by reconstructing a spatial charge distribution estimate for this charge pumping current $I_{cp}$. Then, the calculated channel length $L_{calc}$ is compared with the effective length $L_{eff}$. In case of a mismatch, a new value for the charge pumping current $I_{cp}$ is determined, using the mismatch as information to improve the choice. These steps are repeated until the mismatch substantially becomes zero.

In alternative embodiments, the charge pumping current $I_{cp}$ corresponding to a channel length $L_{calc}$ substantially equal to the effective length $L_{eff}$ can be obtained by linear interpolation of the datapoints ($L_{calc}$, $I_{cp}$), or by solving an analytical function $L_{calc}(I_{cp})-L_{eff}=0$ which is determined from the datapoints ($L_{calc}$, $I_{cp}$).

In a preferred embodiment, the data from the charge pumping curves is further combined to obtain a spatial distribution of charge in traps present at the interface between the channel and a dielectric stack which separates the charge trapping layer from the channel. This embodiment is a method to separately extract the spatial distribution of the charge stored in the charge-trapping layer of a charge-trapping device and of the charge stored in the interface traps. If these two charge distributions are known one can also characterise the injection of holes into this charge-trapping layer, even if a non-uniform distribution of interface traps is created by injection of holes. This method thus also allows separately extracting hole and electron profiles within a charge-trapping layer of a charge-trapping device.

BRIEF DESCRIPTION OF THE DRAWINGS

Exemplary embodiments are illustrated in referenced figures of the drawings. It is intended that the embodiments and figures disclosed herein be considered illustrative rather than restrictive.

DETAILED DESCRIPTION

Figure 1A:
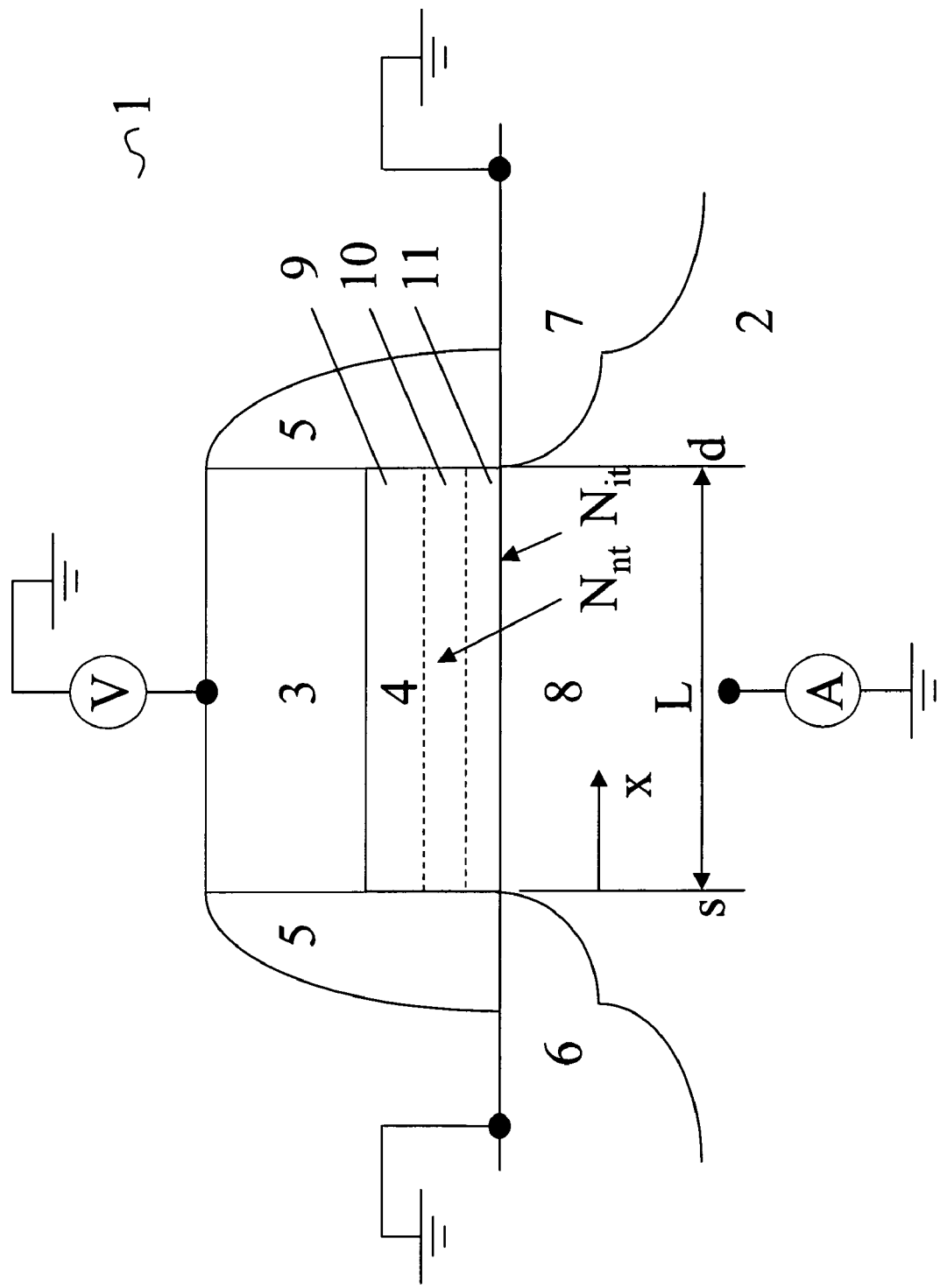
FIGS. 1a-e show (a) schematic cross-section of a measurement set-up for performing charge-pumping measurement of a charge-trapping semiconductor device, (b) a first pulse sequence and (c) the resulting charge-pump curve, (d) a second pulse sequence and (e) the resulting charge-pump curve.

FIG. 1 shows a schematic cross-section of a MOSFET-type device. This device (1) comprises a gate electrode (3) separated from the substrate (2) by a gate dielectric (4). Typically the gate electrode is formed from a semiconductor material such as polycrystalline silicon doped to obtain the desired workfunction and/or conductivity. This semiconductor material can be partially or fully silicided as known in the art or even metals, e.g. Al, TiN, TaN, are used. The gate dielectric (8) comprises a dielectric charge-trapping layer (10) such as silicon-nitride, silicon-rich oxide, silicon-oxynitride, an oxide layer comprising nanocrystals of a semiconductor material, e.g. polycrystalline silicon. Optionally this charge-trapping layer can be separated from the substrate (2) by another dielectric layer (11) with low or no trapping capabilities, e.g. silicon-oxide. Another layer (9) in a similar material as layer (11) can be used to separate the charge-trapping layer (10) from the gate electrode (3). The substrate (2) is a semiconductor substrate, e.g. silicon, silicon-on-insulator (SOI), germanium-on-insulator (GOI). Adjacent to the stack of gate electrode (3) and gate dielectric (4) sidewall spacers (5) formed in a dielectric material such as silicon-oxide, silicon-oxynitride, silicon-carbide, can be present. Aligned to this stack source (6) and drain regions (7) are formed in the substrate (2). The source (6) and drain regions (7) are of an opposite conductivity type as the substrate (2). The source (6) and drain regions (7) extend under the spacers (5) such that the channel region (8) is contacted. This channel region (8) is under dielectric control of the gate electrode (3). The device of FIG. 1 can be manufactured using processing steps and materials known to any person skilled in the art of manufacturing semiconductor devices, in particular non-volatile memory devices.

For the purpose the present description, it is assumed that the device (1) is a nMOS device comprising a polysilicon gate electrode (3), which is n-type doped. Also source (6) and drain (7) regions are n-type doped while the substrate (2) is p-type doped. Sidewall spacers (5) formed in silicon-oxide are present. The gate dielectric (4) consists of a nitride layer used as charge-trapping layer (10) sandwiched between two layers (9, 11) of silicon-oxide. However the invention is not limited to this example. It will be appreciated that there are numerous variations and modifications possible. The device can be a pMOS device comprising device comprising a polysilicon gate electrode (3), which is p-type doped. Also source (6) and drain (7) regions are p-type doped while the substrate (2) is n-type doped. Instead of being a stacked gate device as shown in FIG. 1a the device can be a split gate device such as the HIMOS memory cell disclosed in U.S. Pat. No. 5,583,811 hereby incorporated by reference in its entirety Accordingly, the description should not be deemed to be limiting in scope.

In general, all methods for extracting the spatial distribution of charge $N_{nt}$ stored in the charge-trapping layer (10) of the semiconductor device (1) which are discussed below comprise the following steps: determining a varying base-level voltage $V_{base}$ charge pumping curve, determining a varying top-level voltage $V_{top}$ charge pumping curve, and combining data from the charge pumping curves to obtain the spatial distribution of the stored charge $N_{nt}$. This combination of data is done by establishing a relation between a charge pumping current $I_{cp}$ and a calculated channel length $L_{calc}$ of the semiconductor device by reconstructing spatial charge distribution estimates from the charge pumping curves for multiple values of the charge pumping current $I_{cp}$. From these multiple values of $I_{cp}$ the value is obtained for which the corresponding calculated channel length $L_{calc}$ is substantially equal to the effective channel length $L_{eff}$ of the semiconductor device, this charge pumping current $I_{cp}$ being the maximum charge pumping current $I_{cp\_max}$. Finally the spatial distribution $N_{nt}$ of the charge is extracted by reconstructing the spatial charge distribution from the charge pumping curves using the value of $I_{cp}=I_{cp\_max}$.

In all embodiments described below, separately the spatial distribution of charges within a charge-trapping layer of a charge-trapping device and traps situated at the interface of this layer is extracted. Preferably this charge-trapping device is a non-volatile charge-trapping memory device.

A charge-pumping measurement set-up, which can be used in for determining the charge pumping curves, is schematically shown in FIG. 1a. Source (6), drain (7) and substrate (2) regions are biased to a fixed voltage, preferably 0V or ground. A voltage source, e.g. a pulse generator, is connected to the gate electrode while current is measured at the substrate. This measurement set-up is also known as amplitude-sweep charge-pumping set-up as the amplitude of the voltage pulses applied to the gate electrode is increased during the measurement.

In the embodiment described below, the measurement sequence comprises two steps: first two charge-pumping measurements are performed on a device used as reference and secondly similar charge-pumping measurements are performed on the device-under-test (DUT).

Figure 2:
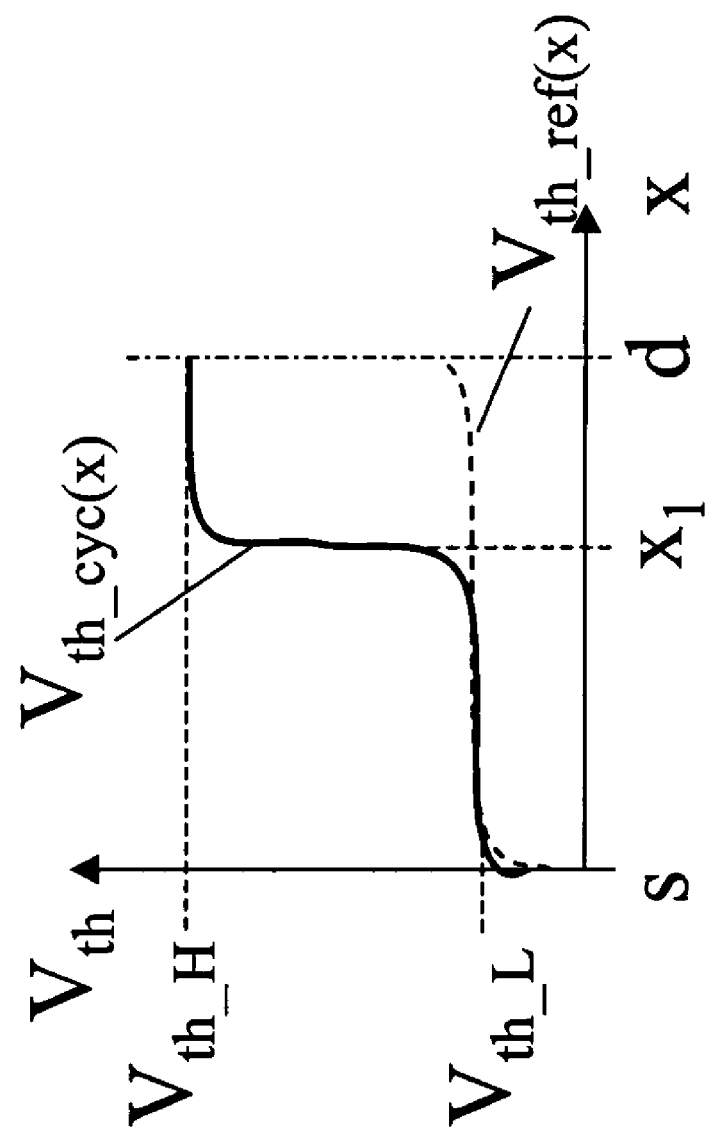
FIG. 2 shows the variation of the threshold voltage along the channel of a programmed charge-trapping semiconductor device.

The reference device is usually the same as the studied device but in a reference state. The studied device needs to have a monotonic increase or decrease of the threshold voltage along the channel, or at least along the part of the channel, which is subjected to the measurement method, typically half of the channel. In this case, each threshold voltage value corresponds to one point of the charge-pumping curve. The reference state of this device, more precisely the threshold voltage distribution thereof depends on the charge already trapped in the studied device. If the threshold voltage distribution in the studied device increases monotonically, it is better to have the reference state having a similar increase in threshold voltage distribution. For instance, the pristine device can be subjected to a light programming operation resulting in a monotonic increase of the charge in the charge-trapping layer which results in a threshold profile $V_{th}(x)$ that monotonic varies along the channel as shown in FIG. 2 by the dotted line $V_{th\_ref}(x)$. In this figure the threshold voltage of the device in the reference state slightly increase near the drain d. The number and distribution of the interface traps should remain essentially unaffected and essentially uniform over the channel. If the threshold voltage distribution monotonically decreases, it is better to have the reference state with also a decreasing threshold voltage distribution. The most natural reference state is in this case the virgin device, where the threshold voltage progressively decreases from the center of the channel to the junction.

Figure 1B:
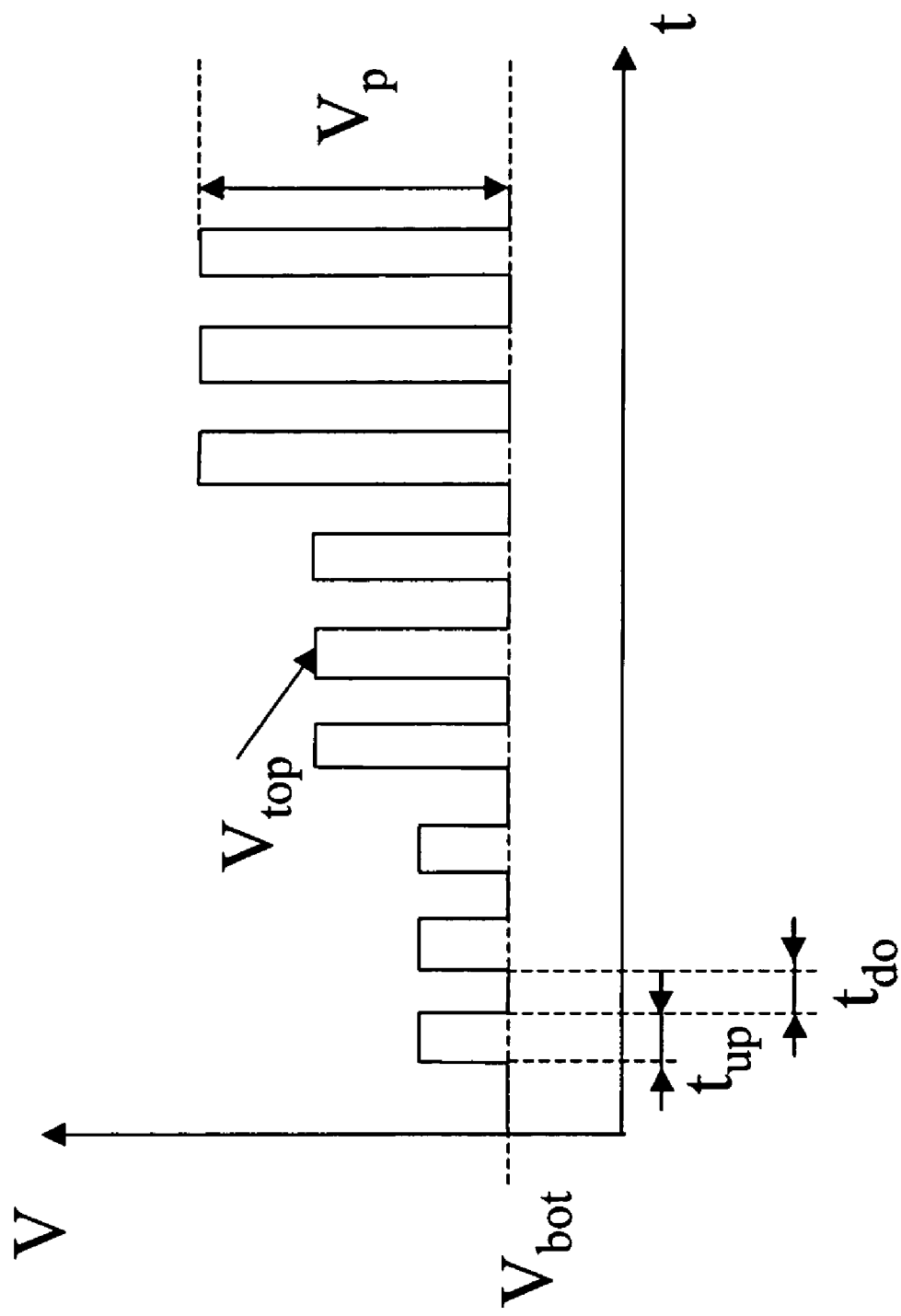
Figure 1C:
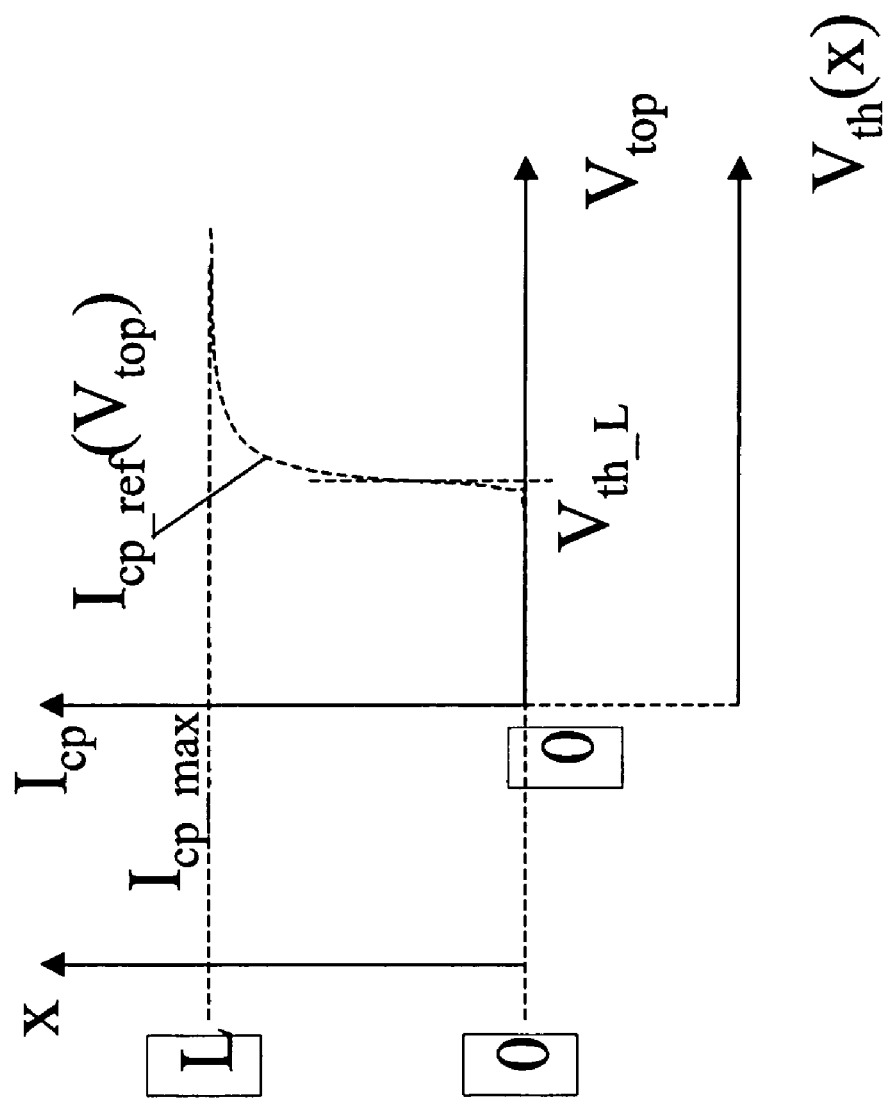
Figure 1D:
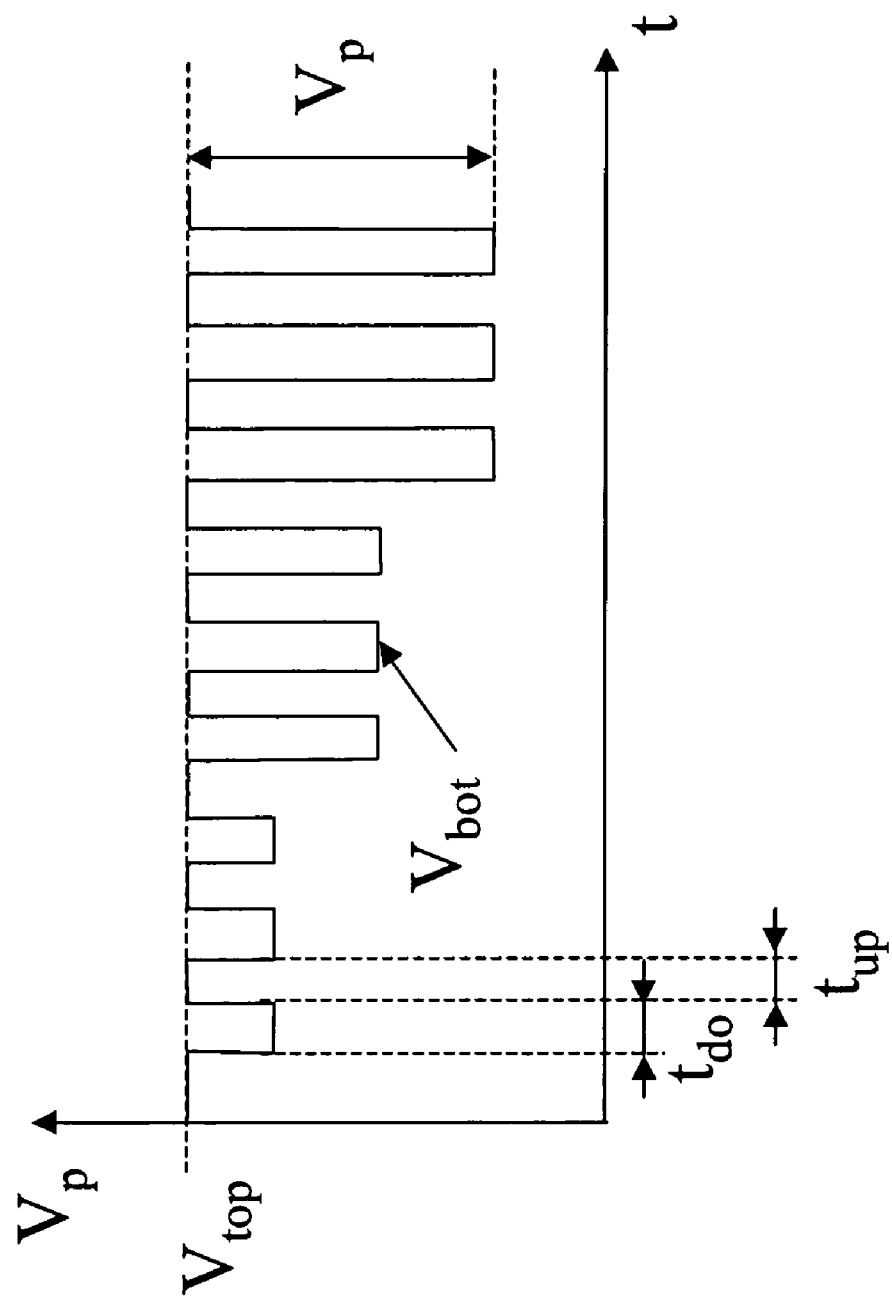

A first charge-pumping measurement, illustrated by FIGS. 1b and 1c, is performed on the device in the reference state that has not yet been electrically stressed, where the interface trap distribution can be considered uniform along the channel. A first pulse train is applied to the gate electrode (3), whereby each pulse in this pulse train has the same bottom-level $V_{bot}$. The amplitude $V_p$ of the pulses increases monotonically with time by increasing the top-level $V_{top}$ of the pulses. The exemplary pulse train shown in FIG. 1b comprises 9 pulses grouped in sets of 3. The pulses in the first set have the lowest amplitude, the pulses in the second set have a higher amplitude, while the pulses in the last set have the highest amplitude. So the amplitude of the pulse in the pulse sequence or the voltage swing of each pulse increases progressively. The number of pulses in the pulse train, their duty cycle, the amplitude of each pulse, the way the amplitude $V_p$ is increased over the pulse train, e.g. stepwise, gradually, and the upper level $V_{top}$ are parameters of choice and can be selected in view of the required accuracy and measurement resolution.

When the bottom level of the pulse $V_{bot}$ is below the flatband voltage $V_{fb\_H}$ of the device (1) and the upper level of the pulse $V_{top}$ is above the threshold voltage $V_{th\_L}$ of the device (1) accumulation and inversion layers will be successively formed at the interface between the channel (8) and the gate dielectric (4). Inversion layer electrons from the source (6) and/or drain (7) regions will fill the interface states $N_{it}$ during the high pulse bias. These interface states thus become negatively charged. When the voltage is dropped below the flatband voltage $V_{fb\_ref}(x)$, accumulation layer holes from the substrate (2) will quickly recombine with the trapped electrons resulting in a charge-pump current $I_{cp}$. The charge-pump current is proportional to the pulse frequency and the number of interface states $N_{it}$ in the inversion region formed in the channel. From this charge-pumping measurement the charge-pump curve $I_{cp}(V_p)$ of this device in the reference state is obtained as shown in FIG. 1c given the current $I_{cp}$ or charge per pulse as function of the top level $V_{top}$ of the pulse train. One can change the vertical axis of this curve by replacing $I_{cp}$ with the position x along the channel: no current corresponds to one end of the channel, e.g. source where x=0, while the maximum $I_{cp\_max}$ current corresponds to the other end of the channel, e.g. drain where x=100%=channel effective length $L_{eff}$. By rearranging this charge-pumping curve by using the method disclosed by Maarten Rosmeulen et al in paragraph 3.3 of "Characterization of the spatial charge distribution in local charge-trapping memory devices using the charge-pumping technique", Solid-State Electronics journal, volume 48 (2004) p 1525-1530, hereby incorporated by reference, a threshold profile curve $V_{th,ref}(x)$ is obtained showing the change of voltage applied to this device as function of its relative position x with respect to source and drain.

Figure 1E:
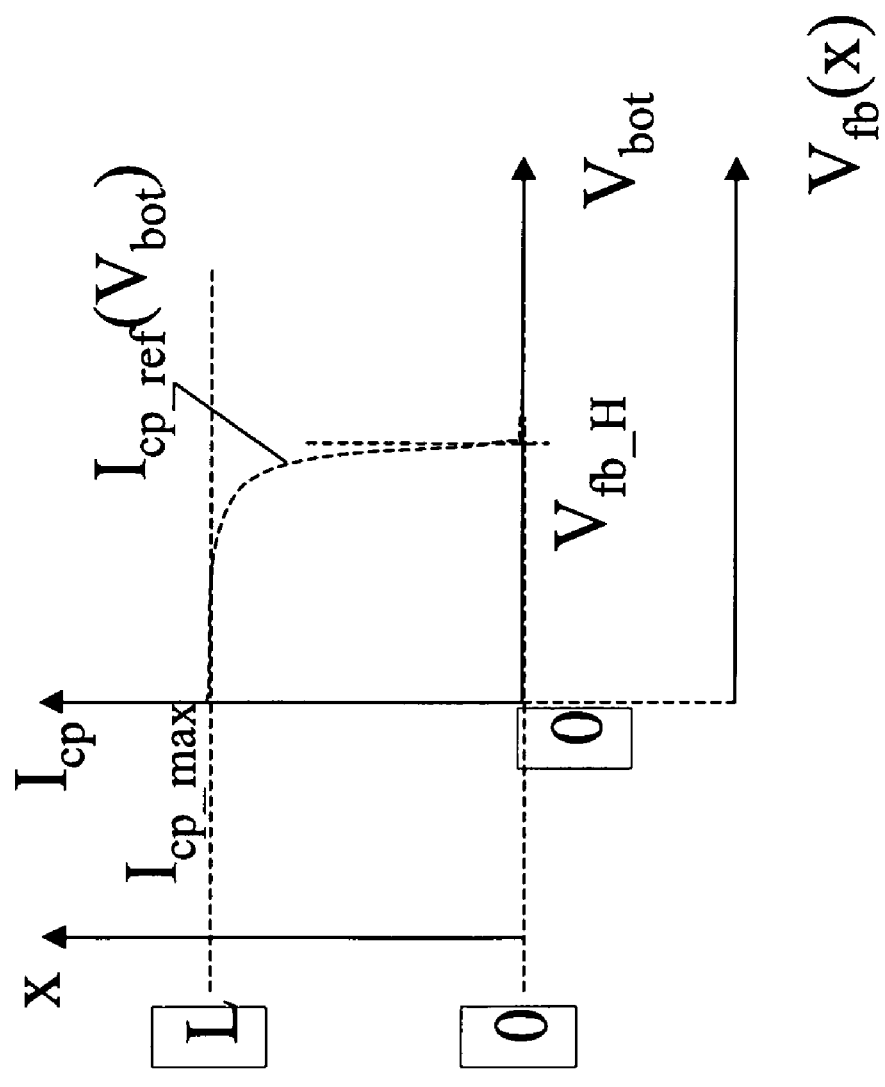

A second charge-pumping measurement is performed on the device in the reference state. A pulse train is applied to the gate electrode (3), whereby each pulse in this pulse train has the same top-level $V_{top}$. The amplitude $V_p$ of the pulses increases monotonically with time by lowering the bottom-level $V_{bot}$ of the pulses. The exemplary pulse train shown in FIG. 1d comprises 9 pulses grouped in sets of 3. The pulses in the first set have the lowest amplitude or voltage swing, the pulses in the second set have a higher amplitude, while the pulses in the last set have the highest amplitude. The number of pulses in the pulse train, their duty cycle, the amplitude of each pulse, the way the amplitude $V_p$ is increased over the pulse train, e.g. stepwise, gradually, the upper level $V_{top}$ are parameters of choice and can be selected in view of the required accuracy and measurement resolution. This pulse train with fixed top-level $V_{top}$ and varying bottom-level $V_{bot}$ will fill the interface states with electrons during the uptime $t_{up}$ of the pulse and with holes during the downtime $t_{do}$ of the pulse when $V_{bot}$ is below the flatband voltage $V_{fb\_H}$. As long as the lower level $V_{bot}$ of the pulse is above the flatband voltage $V_{fb\_H}$, the channel will remain in inversion and the interface traps are always filled with electrons. The channel (8) will switch between inversion and accumulation depending on whether the lower level $V_{bot}$ of the progressively increased pulse amplitude is above or below this flatband voltage $V_{fb\_H}$ and the interface traps will be alternatively filled with electrons and holes during the charge-pumping measurements. From this charge-pumping measurement the charge-pump curve $I_{cp}(V_p)$ of this device in the reference state is obtained as shown in FIG. 1e given the current $I_{cp}$ or charge per pulse as function of the bottom level $V_{bot}$ of the pulse train. One can change the vertical axis of this curve by replacing $I_{cp}$ with the position x along the channel: the maximum $I_{cp\_max}$ current corresponds to one end of the channel, e.g. source where x=0, while no current corresponds to the other end of the channel, e.g. drain where x=100%=channel effective length $L_{eff}$. By rearranging this charge-pumping curve by using the method disclosed by Maarten Rosmeulen et al in paragraph 3.3 of "Characterization of the spatial charge distribution in local charge-trapping memory devices using the charge-pumping technique", in Solid-State Electronics journal, volume 48 (2004) p 1525-1530, hereby incorporated by reference, a flatband profile curve $V_{fb,ref}(x)$ is obtained showing the change of voltage applied to this device as function of its relative position x with respect to source and drain.

A device under test is electrically stressed resulting in charged carriers to be injected into the charge-trapping layer (10). These injected carriers can be positively or negatively charged. In case the device is used as memory cell, one carrier type is used to program the memory cell while the opposite charged carriers are used to erase the memory cell by compensating the distribution profile of the programmed charge. On this device charge-pumping measurements as described herein are performed to determine the contribution to the threshold voltage of the charge $Q_{nt}$ stored in the charge-trapping layer (10) and the charge $Q_{it}$ generated by the interface traps $N_{it}$. The charge $Q_{nt}$ stored in the charge-trapping layer (10) generates a constant offset of the threshold voltage $\Delta V_{th\_Qnt}$, while the offset $\Delta V_{th\_Qit}$ generated by the charge stored in the interface traps depends on whether positive or negative charge is stored in these interface traps and on the number of interface traps $N_{it}$. In inversion the interface traps are filled with electrons causing an upward shift of the threshold voltage, while in accumulation the interface traps are filled with holes causing a downward shift of the threshold voltage. The degradation of a device, e.g. by repetitive electrical stress applied to the device, will change the number of interface traps and hence the threshold voltage offset $\Delta V_{th\_Qit}$. A threshold voltage distribution shown in FIG. 2 can result from negative charge e.g. present in the charge-trapping layer (10) of an nMOS device. A similar figure can be drawn for the flatband voltage distribution of this device. If the device of FIG. 1 is used as non-volatile memory cell, electrons can be injected into this layer (10) during the step of programming the memory cell, e.g. by channel-hot-electron-injection as is known in the art. Holes can be injected during the step of erasing the memory cell, e.g. by band-to-band tunneling induced hot hole injection as is known in the art. This localized trapped charge, e.g. in the region between $x_1$-d, will result in a local increase $V_{th\_ref}(x)$-$V_{th\_cyc}(x)$ of the threshold voltage and of the flatband voltage $V_{fb\_ref}(x)$-$V_{fb\_cyc}(x)$. For the purpose of the present description, it assumed that negative charge $Q_{nt}$ is stored in the charge-trapping layer (10) of an nMOS memory cell (1) resulting in positive shift of the threshold voltage and the flatband voltage, i.e. the threshold voltage and flatband voltage become more positive in these locations where the negative charge $Q_{nt}$ is stored. In real devices the threshold voltage distribution along the channel will is not sharply define as suggested in FIG. 2 but will vary along the channel due to the presence of the junctions and of amongst other the interface traps $N_{it}$ which are distributed along the channel.

Figure 3A:
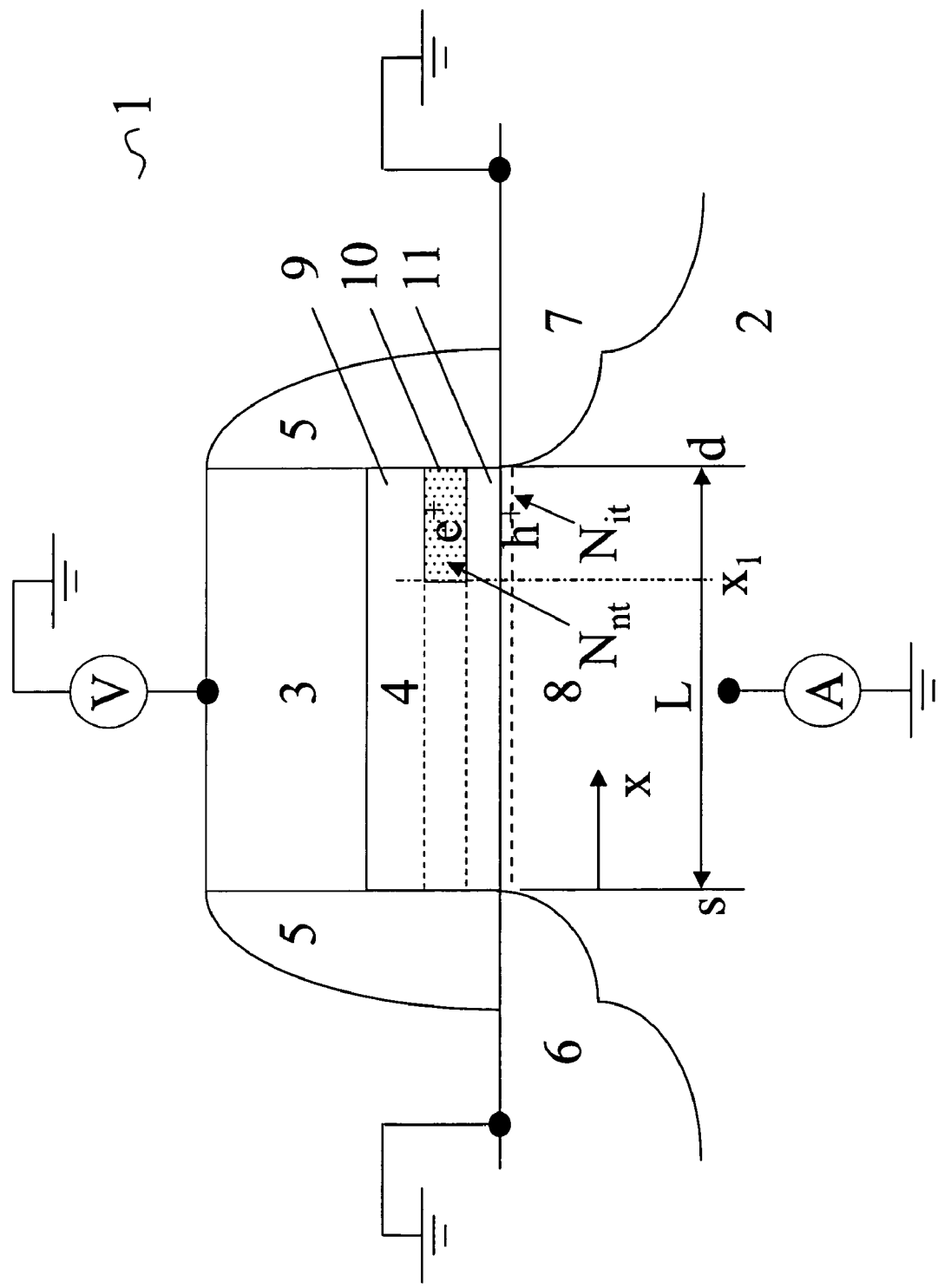
FIG. 3a-c illustrate (a) a schematic cross-section of a measurement set-up, (b) a pulse sequence, and (c) the resulting charge-pump curve.
Figure 3B:
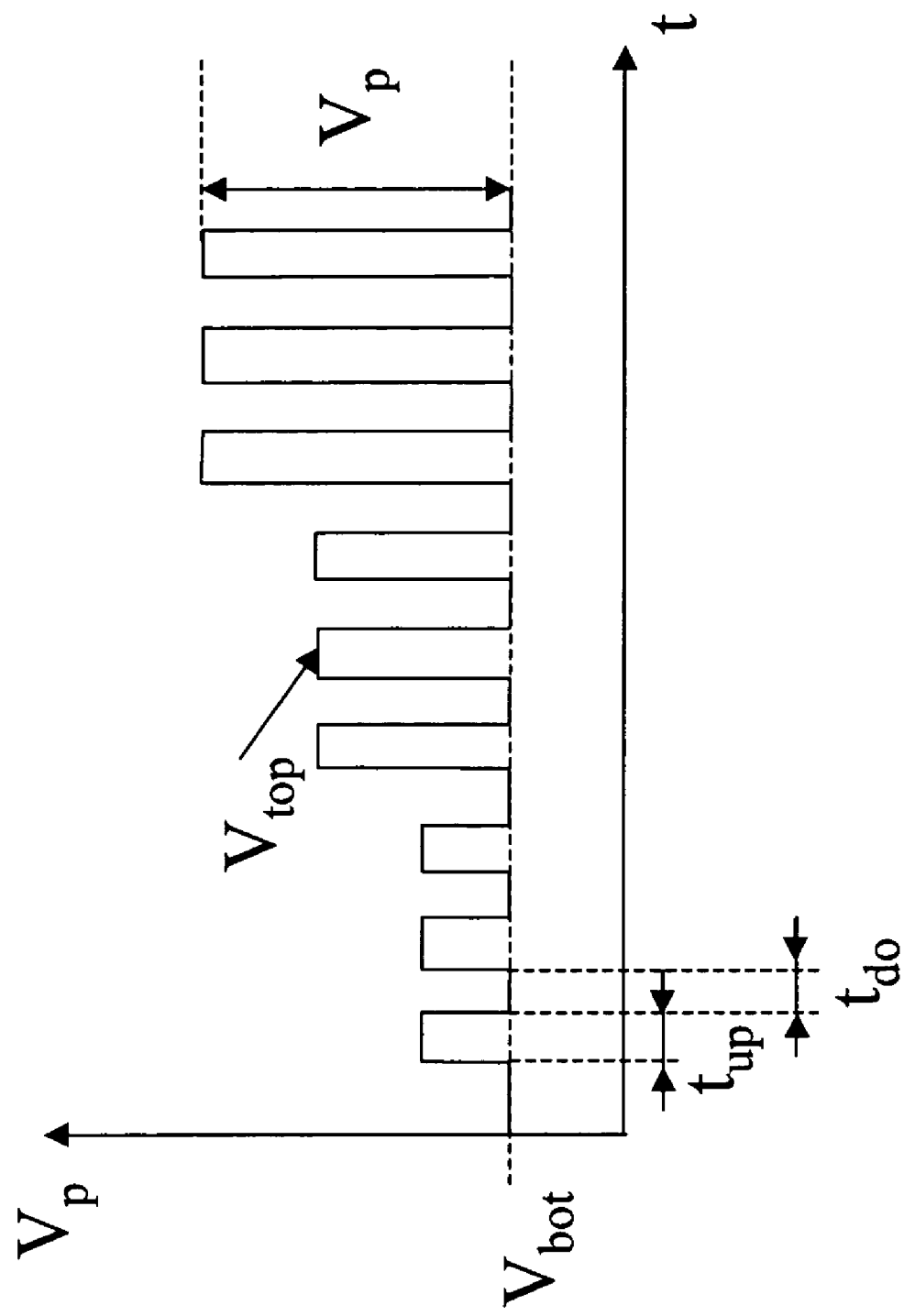
Figure 3C:
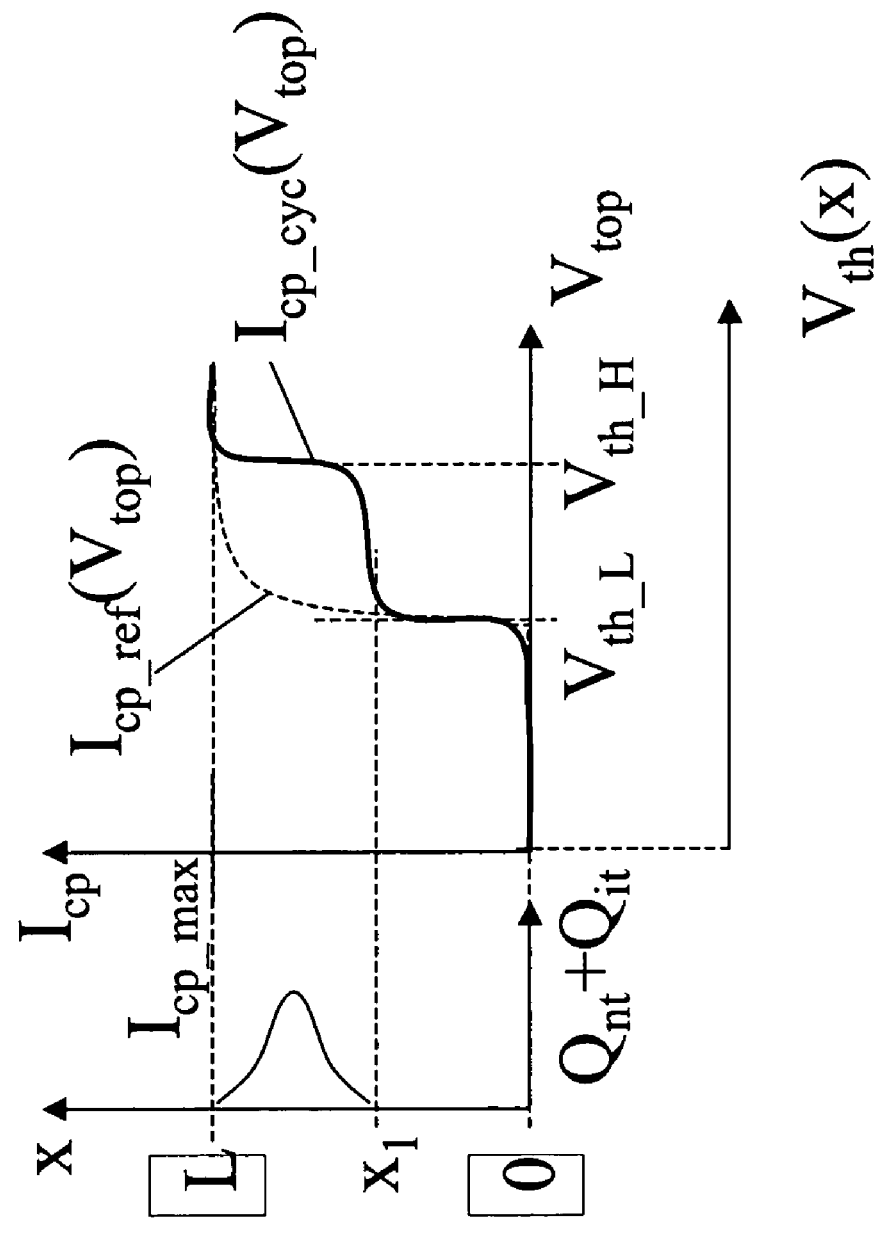

A first charge-pumping measurement is performed on the device under test. FIG. 3a illustrates such a device wherein a number $N_{nt}$ of negative charged particles (dotted area between position $x_1$ and drain d) is stored in the charge-trapping layer (10) resulting in an increase of the threshold voltage and flatband voltage in the portion $x_1$ to d compared to the portion s to $x_1$. A number of interface states $N_{it}$ are present (dots in the channel). A pulse train similar to the pulse train of the first measurement on the device in the reference state and illustrated by FIG. 3b is applied to this device also. As discussed in the first step when measuring the reference device, this pulse train with fixed bottom-level $V_{bot}$ and varying top-level $V_{top}$ will fill the interface states with electrons during the uptime $t_{up}$ of the pulse and with holes during the downtime $t_{do}$ of the pulse in these locations where the pulse is swept over the corresponding threshold voltage. If the number of interface states or the threshold voltage were uniform over the channel (8), one would obtain the same charge-pump current at each pulse independently of the amplitude of the pulse as long as $V_{top}$ is higher than the threshold voltage $V_{th}$. If however the threshold voltage is not constant over the channel, as shown in FIG. 2, with increasing pulse amplitude $V_p$ an increasing portion of the channel will contribute to the charge pump current. As long as the upper level $V_{top}$ of the pulse is lower than the local threshold voltage $V_{th\_H}$ the portion of the channel between $x_1$ and d will not contribute to the charge-pumping current. Until then the portion of channel (8) having the higher threshold voltage $V_{th\_H}$ will remain in accumulation and the corresponding interface traps will be always filled with holes as shown in FIG. 3a by the symbol h+. The portion of the channel (8) having the lower threshold voltage $V_{th\_L}$ will switch between inversion and accumulation depending on whether the upper level $V_{top}$ is above or below this lower threshold voltage and the corresponding interface traps will be alternatively filled with electrons and holes during the charge-pumping measurement. If the pulse sequence of FIG. 3b is applied to the device of FIG. 3a the channel is scanned from source to drain if the threshold voltage $V_{th}(x)$ increases monotonically from the source to the drain. If only half of the channel is degraded, $V_{th}(x)$ needs to be monotonic only on half of the channel. The same procedure as applied to the charge-pumping signal in the first step for extracting the threshold voltage profile $V_{th}(x)$ from the charge-pumping current for the device under test is applied to this stressed device as illustrated by FIG. 3c. A relationship between the threshold voltage profile $V_{th}(x)$ and the location x in the channel can be established by the fact that the increase of the charge-pump current $I_{cp}$ from one location $x_1$ in the channel to another location $x_2$ can be attributed to the number of interface traps $N_{it}$ present in the channel area between these location. This relationship is expressed as follows:

$$\int_{x_1}^{x_2} qf N_{it}(x) dx \approx I_{cp}(V_{th}(x_2)) - I_{cp}(V_{th}(x_1)) \quad [1]$$

with q the absolute value of the electron charge, f the frequency of the pulse. In this figure the dotted line indicates the reference charge-pump curve while the solid line indicates the charge-pumping curve obtained on the stressed device. The deviation between both charge-pump curves and hence in the corresponding threshold voltages is induced by the total charge $(Q_{nt}+Q_{it})$ present, for each point x along the channel, as expressed in the following formula:

$$\Delta V_{th}(x) = V_{th\_ref}(x) - V_{th\_cyc}(x) \quad [2]$$
$$= \frac{\Delta Q_{nt}(x) - \Delta Q_{it}(x)}{2C}$$
$$= \frac{q\Delta N_{nt}(x) - q\Delta N_{it}(x)}{2C}$$

with C the capacitance of the dielectric stack (F/cm$^2$), q the absolute value of the electron charge. The concentration of charge in the charge-storage layer $N_{nt}(x)$ (#/cm$^2$) is positive if electrons are trapped, while the local concentration of interface traps $N_{it}(x)$ is also in (#/cm$^2$). By varying the top level of the voltage applied on the gate as described in this paragraph classical charge-pumping curves are obtained as is known by a person skilled in the art. During this charge-pumping measurement the threshold voltage and flatband voltage at any given point is determined by the charge at that point: electrons stored in the charge-trapping layer (10) and the holes trapped in the interface states. The shift in threshold voltage is indicated in FIG. 3c.

Figure 4A:
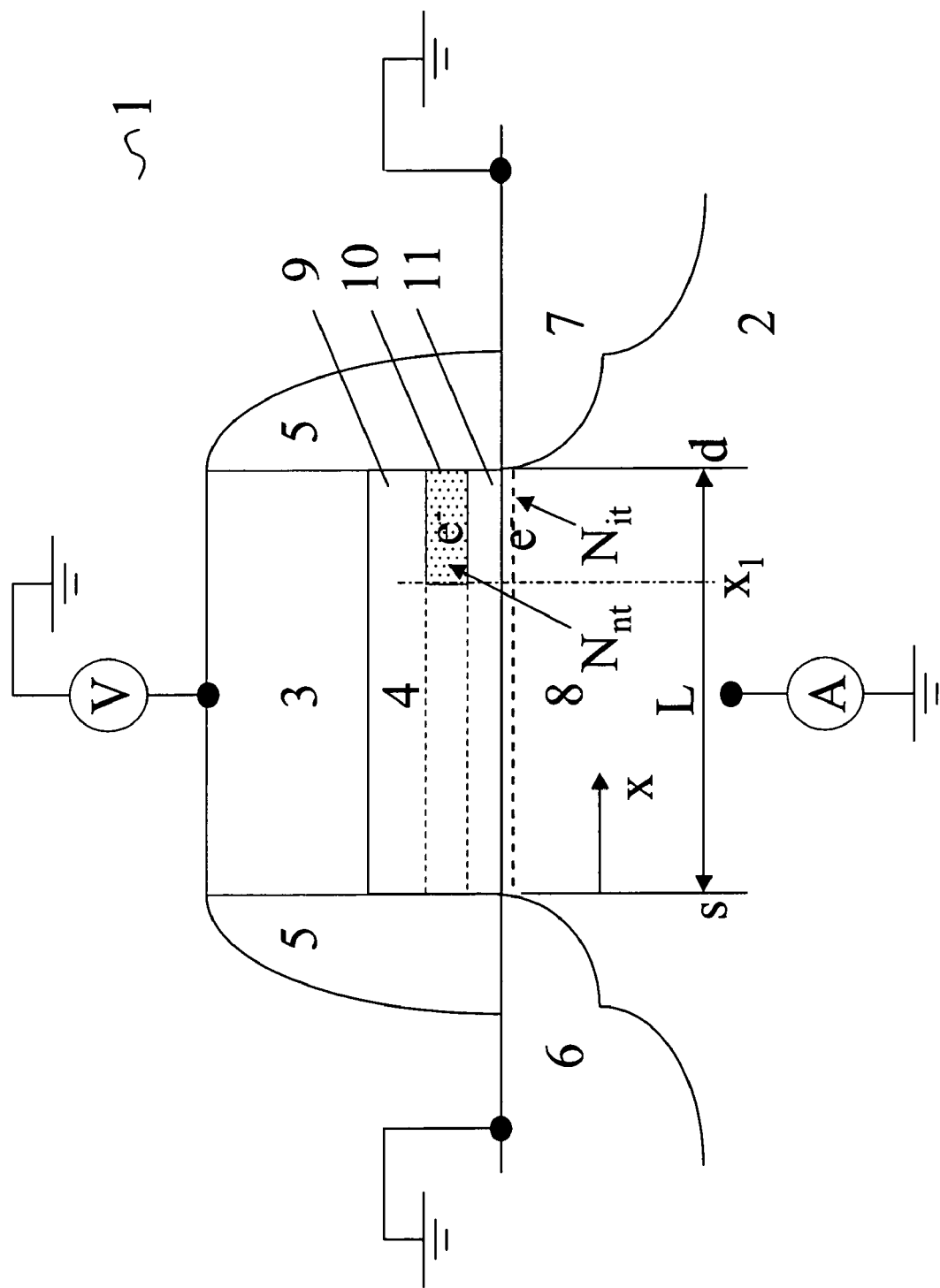
FIG. 4a-c illustrate (a) a schematic cross-section of a measurement set-up, (b) a pulse sequence, and (c) the resulting charge-pump curve.
Figure 4B:
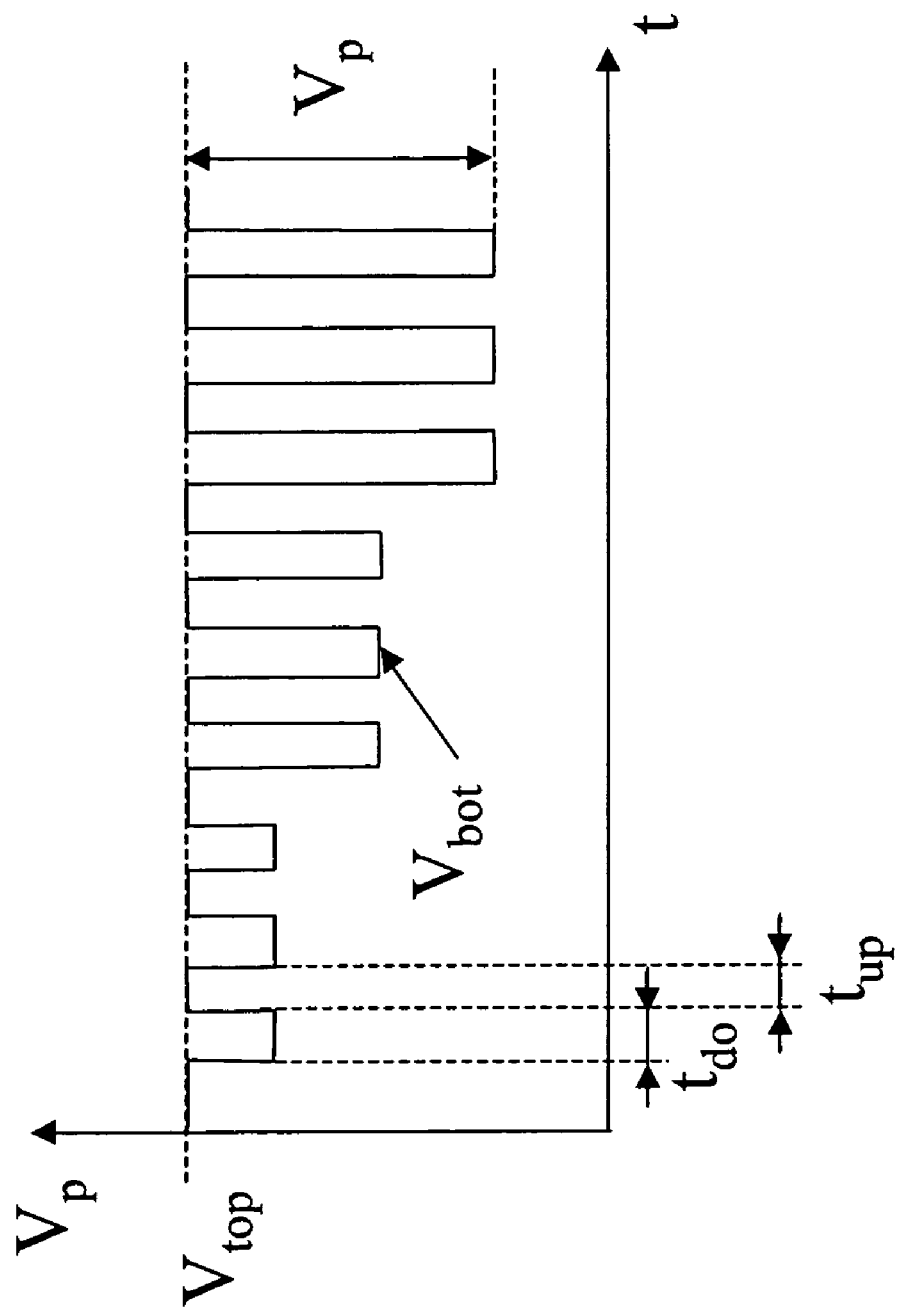
Figure 4C:
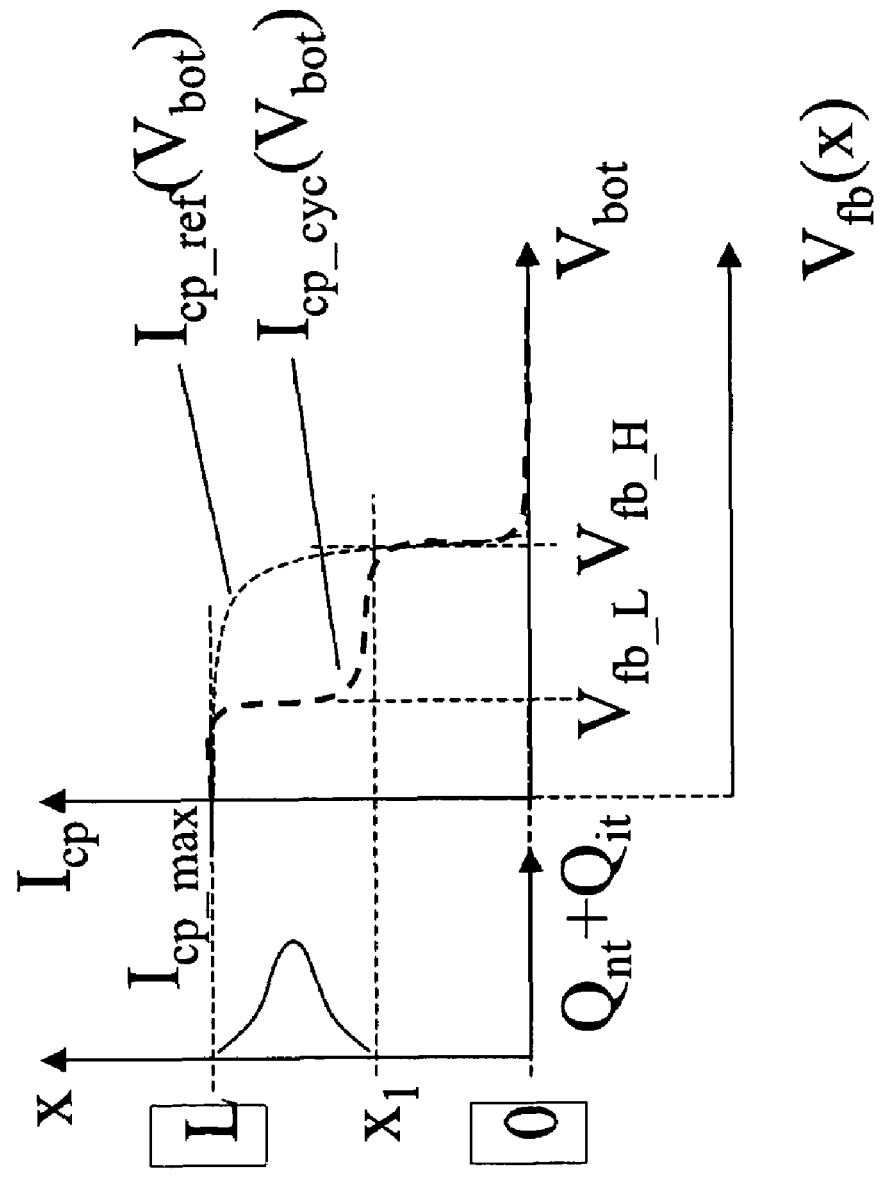

A second charge-pumping measurement is performed on this device under test. FIG. 4a illustrates such a device wherein a number $N_{nt}$ of negative charged particles (dotted area between position $x_1$ and drain d) is stored in the charge-trapping layer (10). A number of interface states Nit is present (dots in the channel). A pulse train, similar to the pulse train applied during the second measurement on the device in the reference state, is applied to the gate electrode (3), whereby each pulse in this pulse train has the same top-level $V_{top}$. The amplitude $V_p$ of the pulses increases monotonically with time by lowering the bottom-level $V_{bot}$ of the pulses. The exemplary pulse train shown in FIG. 4b comprises 9 pulses grouped in sets of 3. The pulses in the first set have the lowest amplitude or voltage swing, the pulses in the second set have a higher amplitude, while the pulses in the last set have the highest amplitude. The number of pulses in the pulse train, their duty cycle, the amplitude of each pulse, the way the amplitude $V_p$ is increased over the pulse train, e.g. stepwise, gradually, the upper level $V_{top}$ are parameters of choice and can be selected in view of the required accuracy and measurement resolution. This pulse train with fixed top-level $V_{top}$ and varying bottom-level $V_{bot}$ will fill the interface states with electrons during the uptime $t_{up}$ of the pulse and with holes during the downtime $t_{do}$ of the pulse in these locations where the pulse is swept over the corresponding flatband voltage. As long as the lower level $V_{bot}$ of the pulse is above the local flatband voltage $V_{fb\_L}$ the portion of the channel between $x_1$ and d will remain in inversion and the interface traps are always filled with electrons as shown in FIG. 4a by the symbol e-. This portion of the channel (8) having the lower flatband voltage $V_{fb\_L}$ will switch between inversion and accumulation depending on whether the lower level $V_{bot}$ of the progressively increased pulse amplitude is above or below this lower flatband voltage and the corresponding interface traps in this region will be alternatively filled with electrons and holes during the charge-pumping measurements. If the pulse sequence of FIG. 4b is applied to the device of FIG. 4a the channel is scanned from drain to source if the flatband voltage $V_{fb}(x)$ increases monotonically from the source to the drain. The same procedure as applied to the charge-pumping signal in the first step for extracting the flatband voltage $V_{fb}(x)$ profile from the charge-pumping current for the device under test is applied to this stressed device as illustrated by FIG. 4c. A relationship between the flatband voltage profile $V_{fb}(x)$ and the location x in the channel can be established by the fact that the increase of the charge-pump current $I_{cp}$ from one location $x_1$ in the channel to another location $x_2$ can be attributed to the number of interface traps $N_{it}$ present in the channel area between these location. This relationship is expressed as follows:

$$\int_{x_1}^{x_2} qf N_{it}(x) dx \approx I_{cp}(V_{fb}(x_2)) - I_{cp}(V_{fb}(x_1)) \quad [3]$$

with q the absolute value of the electron charge, f the frequency of the pulse. In this figure the dotted line indicates the charge-pump curve of the reference device, while the heavy dotted line indicates the charge-pump curve obtained on the stressed device. The deviation between both charge-pump curves and hence in the corresponding flatband voltages is induced by the total charge $(Q_{nt}+Q_{it})$ present, for each point x along the channel, as expressed in the following formula:

$$\Delta V_{fb}(x) = V_{fb\_ref}(x) - V_{fb\_cyc}(x) \quad [4]$$
$$= \frac{\Delta Q_{nt}(x) + \Delta Q_{it}(x)}{2C}$$
$$= \frac{q\Delta N_{nt}(x) + q\Delta N_{it}(x)}{2C}$$

with C the capacitance of the dielectric stack (4) (F/cm$^2$) and q the absolute value of the electron charge. The concentration of charge in the charge-storage layer $N_{nt}(x)$ (#/cm$^2$) is positive if electrons are trapped, while the local concentration of interface traps $N_{it}(x)$ is also in (#/cm$^2$). By varying the bottom level of the voltage pulses applied on the gate as described in this paragraph the charge-pumping curves of FIG. 4c are obtained. During this charge-pumping measurement the threshold voltage and flatband voltage at any given point is determined by the charge at that point: electrons stored in the charge-trapping layer (10) and the electrons trapped in the interface states.

Figure 5:
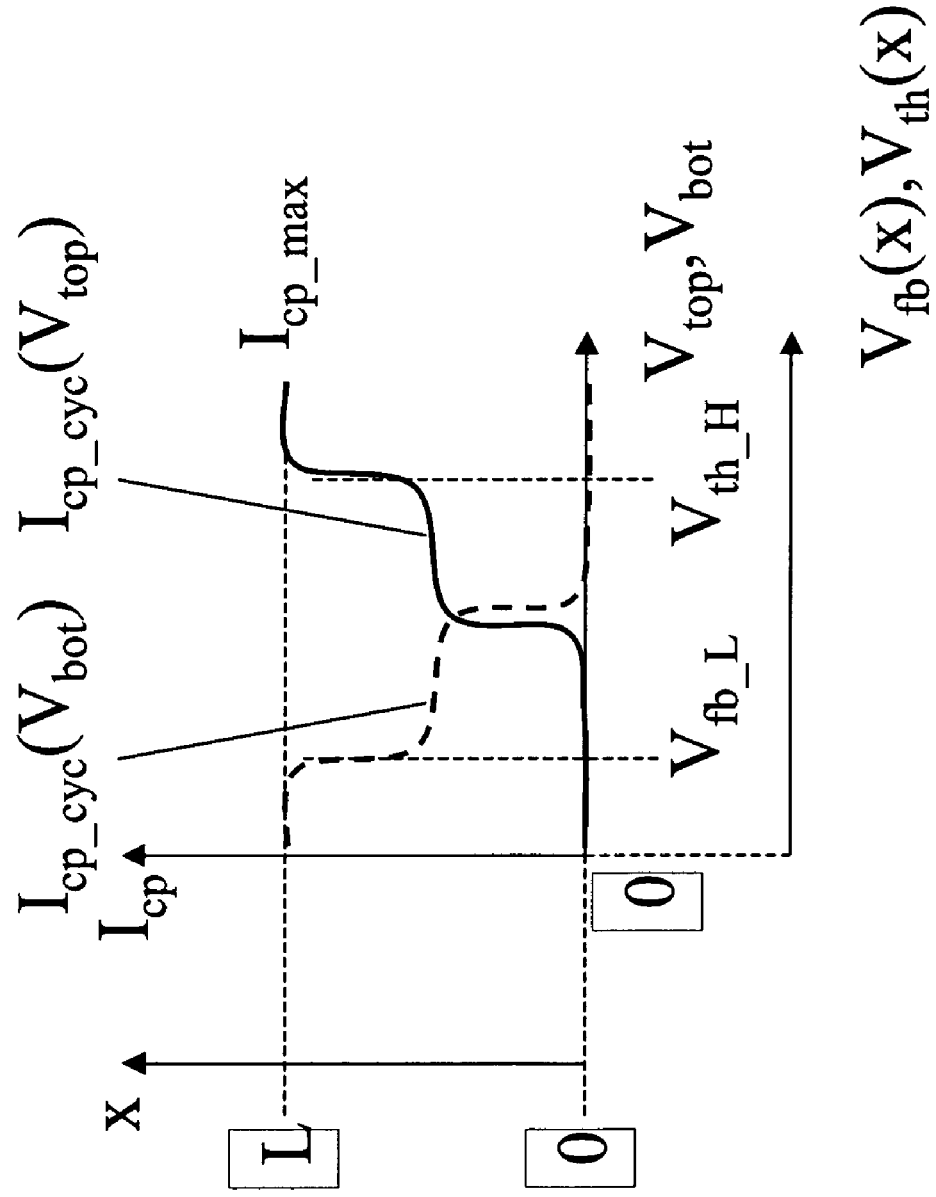
FIG. 5 illustrates a charge-pump curve.

The charge-pumping curves obtained on the stressed device are compared with the charge-pumping curve of the reference device or unstressed device. The deviation between the reference curves on the one hand and the corresponding stressed curves is due to the overall threshold or flatband voltage variation caused by the charge in the charge-trapping layer (10) and in the interface states. The difference between the two deviations is due to the charge in the interface states only. FIG. 5 combines the two charge-pump curves obtained on the stressed device. In both cases the maximum current measured $I_{cp\_max}$ is substantially the same, such that for any location x in the channel, the following relationship holds:

$$I_{cp}(x)(\text{varying top level}) + I_{cp}(x)(\text{varying bottom level}) = I_{cp\_max} \quad [5]$$

Figure 6:
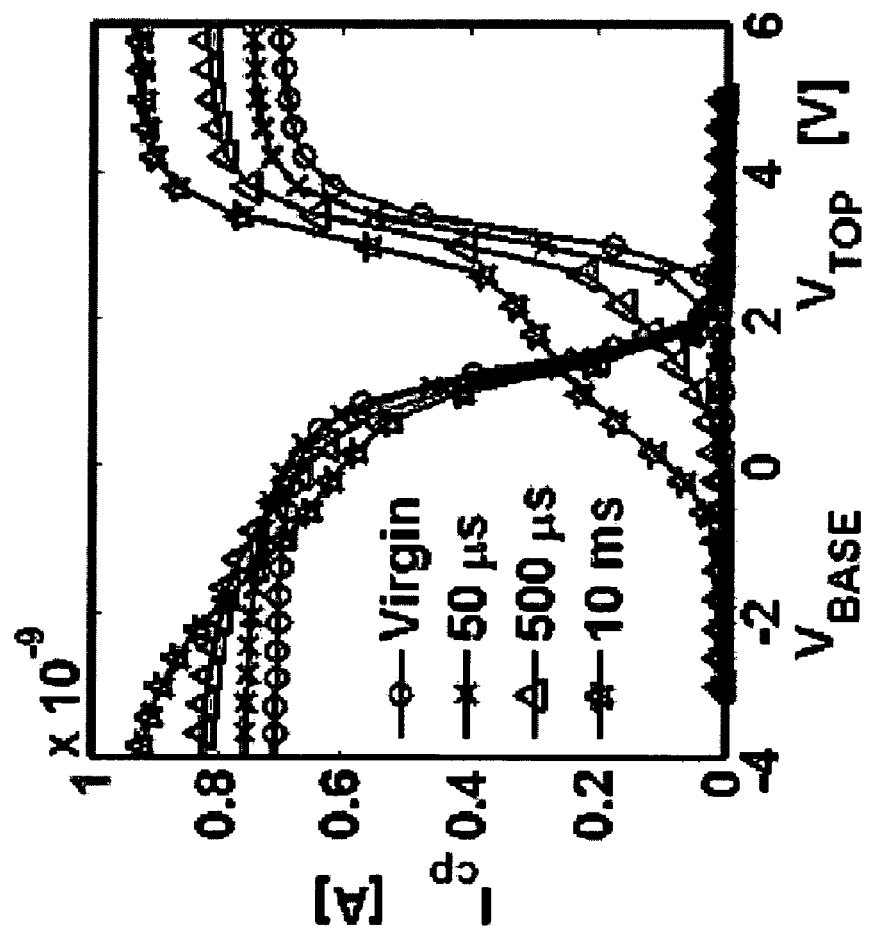
FIG. 6 shows charge-pumping curves for varying top-level or bottom-level.

The correlation between the two measurements on the stressed device depend on $I_{cp\_max}$, which makes the results of the extraction very sensitive to this value. Theoretically, the charge-pumping curves saturate completely if the top level of the pulse is high enough (or if the base level of the pulse is low enough, following the type of measurement). The measurements in FIG. 6 show that the saturation is in reality not perfect, curves slightly continue to increase for high voltages. This causes incertitude on $I_{cp\_max}$. The best choice of $I_{cp\_max}$ is explained later in this text.

Using the data from the charge-pumping measurements with respectively varying top and bottom level performed on the device in the reference state (FIG. 1c, 1e) and on the cycled device (FIG. 3c, 4c) and the above equations ([1], [2], [3], [4], [5]) one can determine the contribution of the charge in the charge-trapping layer (10) and of the charge in the interface states to the change in threshold voltage.

Equations [2] and [4] can be combined to yield the following formula:

$$(V_{\text{th\_ref}}(x) - V_{\text{fb\_ref}}(x)) - (V_{\text{th\_cyc}}(x) - V_{\text{fb\_cyc}}(x)) = \frac{q \Delta N_{it}(x)}{C} \quad [6]$$

Equation [1] can be written as:

$$\int_{x_{i-1}}^{x_i} q f N_{it}(x) dx \approx ((N_{it}(x_i) - N_{it}(x_{i-1}))\left(\frac{x_i - x_{i-1}}{2}\right) \quad [7]$$
$$\approx I_{cp}(V_{\text{th\_cyc}}(x_i)) - I_{cp}(V_{\text{th\_cyc}}(x_{i-1}))$$

By solving successively equations [6] and [7] from a starting point $x_o$ to a final point $x_{end}$ one can find the position $x_i$ from equation [7] which corresponds to the interface states $N_{it}(x_i)$ from equation [6]. The profile of charge in the charge-trapping layer can be found by either solving equation [2] or [4].

The method allows an easy way to check the precision of the extracted profiles. Indeed, the last calculated position $x_{end}$ corresponds to the effective length of the channel:

$$x_{end} = L_{eff} \quad [8]$$

As explained before, the results are very sensitive to $I_{cp\_max}$. $I_{cp\_max}$ is then chosen such as equation [8] is verified. The use of $I_{cp\_max}$ as a variable and the addition of the equation [8] allow a higher accuracy on the extracted profiles. This is made possible by the new direct method to solve the equations [5-7].

In the following paragraph the extraction procedure is discussed in more detail. If the difference $(V_{th\_ref}(x) - V_{fb\_ref}(x))$ in equation [6] is constant, because the number of interface traps $N_{it,ref}$ of the device in the reference state is constant and equal to the ratio $(I_{cp\_max}/L_{eff})$ this difference is given by combining the threshold voltage profile and flatband voltage profile given by respectively FIGS. 1c and 1e. For the device in the reference state, equation [5] allows to determine for a selected threshold voltage $V_{th\_cyc}$ the corresponding flatband voltage $V_{fb\_cyc}$, as the sum of the corresponding charge-pump currents are equal to the maximum charge-pump current $I_{cp\_max}$. The starting point $x_o$ is selected such that the threshold voltage $V_{th\_cyc}(x_o)$ is not shifted and the number of interface states $N_{it}(x_o)$ is equal to the number of interface states in the device in the reference state $N_{it,ref} = (I_{cp\_max}/L_{eff})$. By directly solving equations [6] and [7] successively for all measurement points in the charge-pump curve from this starting point $x_i = x_o$ to $x_i = x_{end}$, one can find the position $x_i$ from equation [7] which corresponds to the interface states $N_{it}(x_i)$ from equation [6]. The profile of charge in the charge-trapping layer can be found by either solving equation [2] or [4].

If the difference $(V_{th\_ref}(x) - V_{fb\_ref}(x))$ in equation [6] is not constant, equations [6] and [7] cannot be solved directly. Both equations are then rewritten in the form "$N_{it}(x_i)=$" which can be solved numerically.

$$N_{it}(x_i) = N_{it,ref} + \frac{C}{q}[(V_{\text{th\_ref}}(x) - V_{\text{fb\_ref}}(x)) - (V_{\text{th\_cyc}}(x) - V_{\text{fb\_cyc}}(x))] \quad [9]$$

$$N_{it}(x_i) = \frac{2[I_{cp}(V_{\text{th\_cyc}}(x_i)) - I_{cp}(V_{\text{th\_cyc}}(x_{i-1}))]}{x_i - x_{i-1}} - N_{it}(x_{i-1})$$

Hence the extraction technique described herein allows determining the contribution of the charge in the charge-trapping layer (10) and of the charge in the interface states to the change in threshold voltage.

In FIG. 5 the two charge-pumping curves used in the extraction method of the previous embodiments are shown. Ideally the charge-pumping current $I_{cp}$ reaches a maximum charge-pumping current $I_{cp\_max}$ corresponding to a voltage bias $V_{top}$ or $V_{bot}$ wherein the complete area of the channel (8) having a known channel length $L_{eff}$ contributes to the charge-pumping current. For this well-defined maximum charge-pumping current $I_{cp\_max}$ one can reconstruct the spatial distribution of charge $N_{nt}$ stored in the charge-trapping layer (10) of a semiconductor device (1). However in real measurements the current measured when applying a varying base-level or top-level voltage pulse sequence might not reach a maximum value and will continue to vary with varying pulse voltage. When such charge-pumping curves are obtained one can determine the maximum charge-pumping current $I_{cp\_max}$, corresponding to the complete area of the channel (8) having a known channel length $L_{eff}$, from the effective charge-pumping curves in various ways some of which are described in the embodiments below.

In a preferred embodiment of the extraction method, the charge pumping curves are combined as follows. As described before, a relation between the charge pumping current $I_{cp}$ and the calculated channel length $L_{calc}$ of the semiconductor device is established. In this embodiment, this is done by selecting on one of the charge pumping curves at least two charge pumping currents $I_{cp}$ and determining the calculated channel length $L_{calc}$ corresponding to each of the charge pumping currents $I_{cp}$ by reconstructing a spatial charge distribution estimate for each of the charge pumping currents $I_{cp}$. In this way, a set of at least two datapoints ($L_{calc}$, $I_{cp}$) is obtained. From this set of datapoints, the charge pumping current $I_{cp}$ having a channel length substantially equal to the effective length $L_{eff}$, i.e. the maximum charge pumping current $I_{cp\_max}$, can be obtained as follows.

For example, various existing numerical techniques can be used to determine from this set of at least two datapoints ($L_{calc}$, $I_{cp}$), the datapoint ($L_{calc}=L_{eff}$, $I_{cp}=I_{cp\_max}$). Once can use known numerical analytical techniques such as linear interpolation or binary search to determine this datapoint ($L_{eff}$, $I_{cp\_max}$). A person skilled in the art will appreciate that the first values of the charge pump current $I_{cp}$ are selected from the upper current range of the measured charge-pumping curve as such selection will speed up the extraction process.

As an alternative, an analytical function $L_{calc}(I_{cp})-L_{eff}=0$ can be determined from the set of at least two datapoints ($L_{calc}$, $I_{cp}$) and by solving this analytical function the charge pumping current $I_{cp}$ having a channel length substantially equal to the effective length $L_{eff}$, i.e. the maximum charge pumping current $I_{cp\_max}$ can be determined. Then, the the spatial distribution $N_{nt}$ of the charge is extracted by reconstructing the spatial charge distribution from the charge pumping curves using the value of $I_{cp}=I_{cp\_max}$. A person skilled in the art will appreciate that the first values of the charge pump current $I_{cp}$ are selected from the upper current range of the measured charge-pumping curve as such selection will speed up the extraction process.

Another alternative could be to combine the data from the charge pumping curves as follows. Again a relation between the charge pumping current $I_{cp}$ and a calculated channel length $L_{calc}$ of the semiconductor device is established by selecting on one of the charge pumping curves a value of the charge pumping current $I_{cp}$ and determining the calculated channel length $L_{calc}$ corresponding to this charge pumping current $I_{cp}$ by reconstructing a spatial charge distribution estimate for this charge pumping current $I_{cp}$. In this embodiment however, the calculated channel length $L_{calc}$ is compared with the effective length $L_{eff}$ and in case of a mismatch, a new value for the charge pumping current $I_{cp}$ is determined using the information given by the mismatch, such that the selection of the value for the charge pumping current $I_{cp}$ is optimised. This sequence of steps is repeated until the mismatch between the calculated channel length $L_{calc}$ and the effective length $L_{eff}$ is substantially zero, in which case this the determined charge pumping current $I_{cp}$ corresponds to the maximum charge pumping current $I_{cp\_max}$. The spatial distribution $N_{nt}$ of the charge is then extracted by reconstructing the spatial charge distribution from the charge pumping curves using this value of $I_{cp}=I_{cp\_max}$. A person skilled in the art will appreciate that the first values of the charge pump current $I_{cp}$ are selected from the upper current range of the measured charge-pumping curve as such selection will speed up the extraction process.

In the above extraction methods the determined charge pumping current $I_{cp}$ is said to correspond to the maximum charge pumping current $I_{cp\_max}$, when the difference between the obtained calculated channel length $L_{calc}$ and the effective length $L_{eff}$ is less than 2%, preferably less than 1% of the effective channel length $L_{eff}$.

Although the extraction methods according to the present application are particularly useful for extracting the spatial distribution of charge $N_{nt}$ stored in the charge-trapping layer (10) of a memory device (1), these extraction methods can be applied to any kind of semiconductor device (1) wherein a dielectric stack (4) is sandwiched between an electrode (3) and a semiconductor region (2). The disclosed extraction methods can be used to the extract charge stored in this dielectric stack (4). For example in a MOSFET, used as logic transistor, charge might be unintentionally incorporated in the gate dielectric (4). Typically this incorporated charge might result from the device operation, e.g. hot carriers, or result from the semiconductor manufacturing process introducing fixed or mobile charge in the gate dielectric. This gate dielectric can be of a single dielectric material such as silicon-oxide, silicon-oxy-nitride, a high-k dielectric such as alumina-oxide, hafnium-oxide, hafnium-silicon-oxide as known in the art. Likewise this gate dielectric can be a stack of dielectric materials, e.g. a high-k dielectric formed upon a silicon-oxide. As is the case for the memory device in the previous embodiments, this charge $N_{nt}$ will also influence the threshold voltage profile $V_{th}(x)$ and flatband voltage profile $V_{fb}(x)$ of the logic transistor. Hence the disclosed extraction methods can also be applied to such logic transistor to determine the spatial distribution of the incorporated charge $N_{nt}$.

In the disclosed extraction methods the spatial charge distribution $N_{nt}$ is reconstructed from the charge pumping curves by combining data from these charge pumping curves to obtain the spatial distribution. This data from the charge pumping curves can be further combined to obtain a spatial distribution of charge ($N_{it}$) in traps present at the interface between the channel (8) and a dielectric stack (4). Hence the present extraction methods also allow determining the spatial distribution of this interface charge $N_{it}$, even when charge is present in the dielectric stack (4). The dependency of this interface charge on parameters of the semiconductor process or of device operation can thus more accurately be determined.

Figure 7:
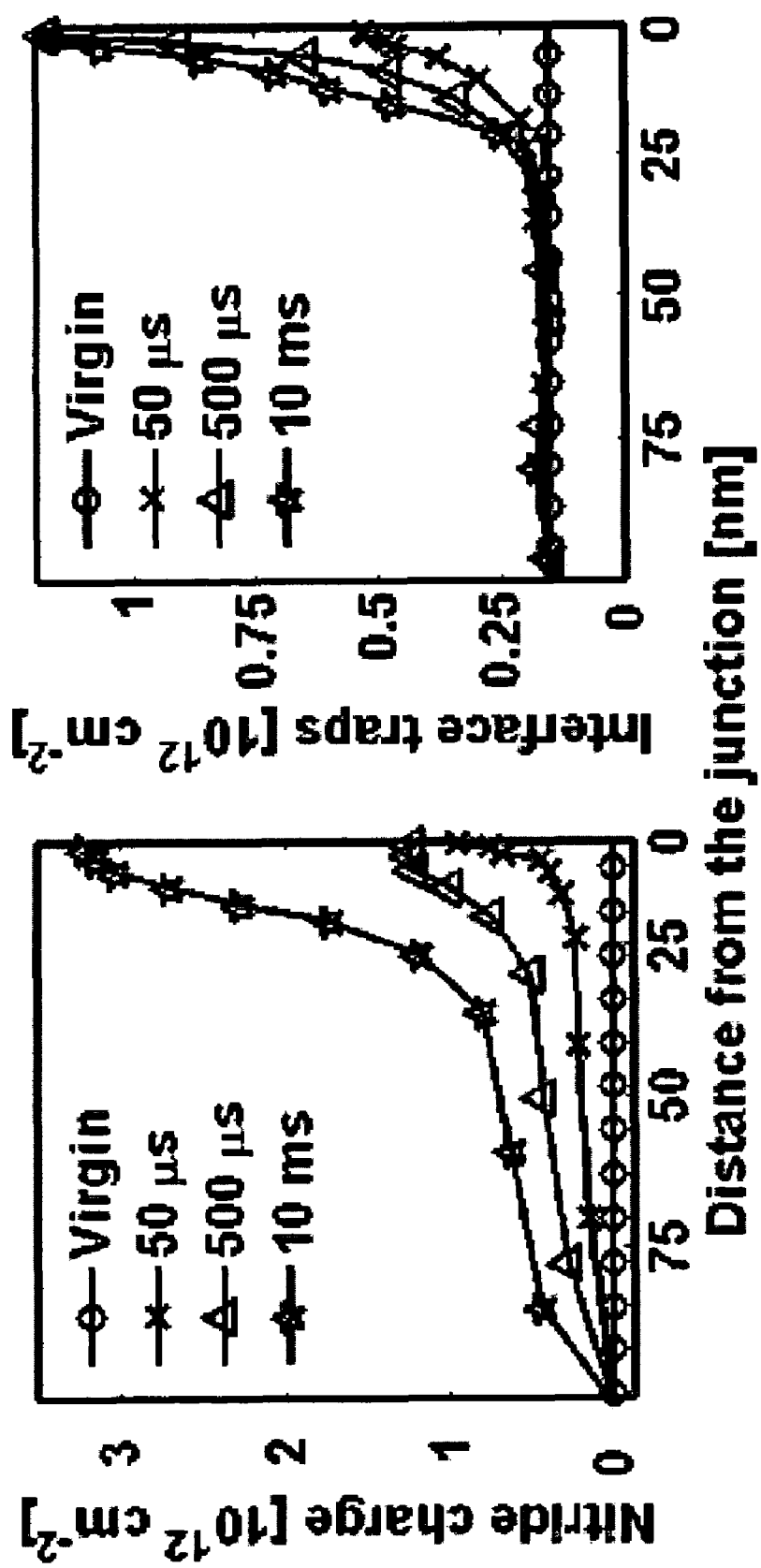
FIG. 7 shows the distribution profile of the charge in charge-trapping layer and in the interface traps.
Figure 8:
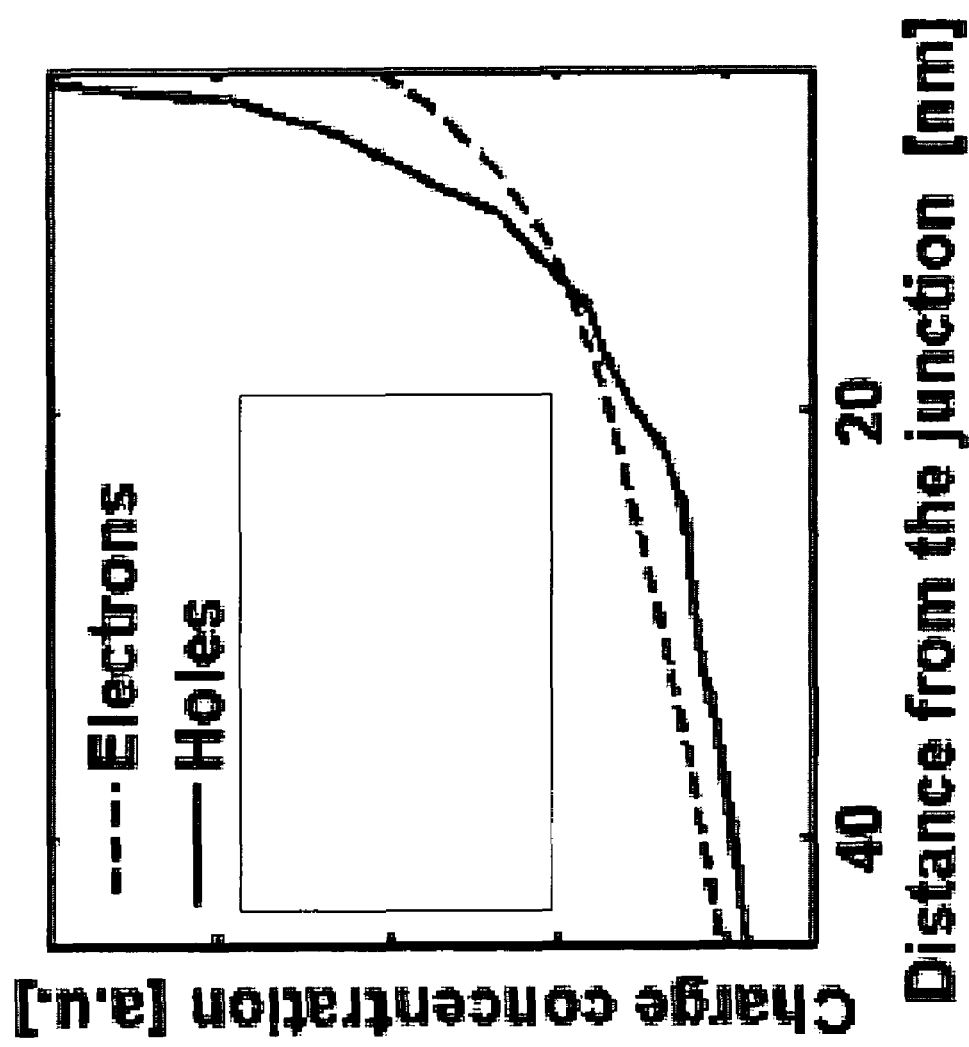
FIG. 8 shows the distribution profile of charge in the trapping-layer for respectively electrons and holes following a program and erase operation.

FIGS. 6 to 8 illustrate a preferred embodiment.

FIG. 6 shows two sets of charge-pumping curves obtained using respectively the varying top-level and varying-base level pulse sequence described above. The rising curves are obtained using the fixed-bottom/varying top-level pulse sequence. The falling curves are obtained using the fixed-bottom/varying base-level pulse sequence. Each set contains a curve for a reference device, i.e. an unstressed nMOS device with an ONO layer as gate dielectric, and curves for the same nMOS devices (1) that were subjected to respectively 50 us, 500 us and 10 ms of hole injection. Nitride was used as charge-trapping layer. Holes where injected using typical state-of-the art voltage settings: grounding of source and bulk applying −5V to the gate and 5V to the drain. The longer the injection time the more positive charge is stored in the device and the larger the shift in the charge-pumping curve compared to the virgin device.

From these curves the distribution of the charge in the nitride layer ($N_{nt}$) and in the interface traps ($N_{it}$) for the respective devices can be extracted with the extraction technique described herein. FIG. 7 shows the corresponding distribution curves. With progressive injection of holes the interface becomes more degraded.

Using the charge-pumping technique described herein allows extracting the distribution profile of the charge in the nitride layer whether electrons or holes are trapped in this nitride layer while, taking the degradation of the interface states into account. FIG. 8 shows the distribution profile of the charge in the nitride layer of an nMOS memory cell after a programming operation when electrons are trapped and of the charge in the nitride layer of an nMOS memory cell after an erase operation when holes are trapped. Programming of an nMOS memory cell was done by using typical state-of-the-art voltage settings: grounding of source and substrate, applying 9V to the gate and 3.5V to the drain. Erasing of an nMOS memory cell was done by using typical state-of-the-art voltage settings: grounding of source and substrate, applying −5V to the gate and 5V to the drain.

Prior art charge-pumping measurement techniques can only extract the electron distribution in a charge-trapping layer (10), e.g. injected therein during the programming operation of a memory cell, by assuming that the interface traps do not affect the threshold voltage. In particular the additional interface traps created when injecting holes in the charge-trapping layer (10), e.g. when erasing a memory cell, makes the extraction of the charge distribution in the charge-trapping layer impossible using these prior art charge-pump techniques due to the sensitivity of the charge-pumping measurement to this interface degradation. By using two charge-pumping measurements with respectively varying top-level and bottom-level, it is possible to extract the dielectric charge and interface traps such that the distribution profile of both electrons and holes in the dielectric layer (10) can be obtained. The thus obtained hole and electron distribution profiles are used for physical understanding and further optimization of charge-trapping devices. The extraction method allows extracting the distribution of the electrons and holes injected into the charge-trapping layer (10) of the memory device and hence to determine voltage settings for maintaining substantially the same charge distribution. By applying this extraction method one can extract not only the distribution of the electrons after a programming operation but also the distribution of holes after an erasing operation. This extraction is more accurate as the degradation of the interface states is taken into account.

The invention claimed is:

1. A method for extracting the spatial distribution of charge ($N_{nt}$) stored in a charge-trapping layer of a semiconductor device having a channel underneath the charge trapping layer with an effective length $L_{eff}$, comprising:
   a) determining a varying base-level voltage charge pumping curve,
   b) determining a varying top-level voltage charge pumping curve, and
   c) combining data from the charge pumping curves to obtain the spatial distribution,
   wherein step c) comprises the steps of:
   d) establishing a relation between a charge pumping current $I_{cp}$ and a calculated channel length $L_{calc}$ of the semiconductor device by reconstructing spatial charge distribution estimates from the charge pumping curves for multiple values of the charge pumping current $I_{cp}$,
   e) obtaining from the multiple values of $I_{cp}$ the value for which the corresponding calculated channel length $L_{calc}$ is substantially equal to the effective channel length $L_{eff}$ of the semiconductor device, and
   f) reconstructing the spatial charge distribution from the charge pumping curves using the value of $I_{cp}$ obtained in step e).

2. A method according to claim 1, wherein steps d) to e) comprise:
   g) selecting on one of the charge pumping curves one value of the charge pumping current $I_{cp}$,
   h) determining the calculated channel length $L_{calc}$ corresponding to the selected charge pumping current $I_{cp}$ by reconstructing a spatial charge distribution estimate for the charge pumping current $I_{cp}$,
   i) comparing the calculated channel length $L_{calc}$ with the effective length $L_{eff}$ and in case of a mismatch, determining from the mismatch a new value for the charge pumping current $I_{cp}$, and
   j) repeating steps h) to i) until the mismatch between the calculated channel length $L_{calc}$ and the effective length $L_{eff}$ is substantially zero.

3. A method according to claim 1, wherein steps d) to e) comprise:
   k) selecting on one of the charge pumping curves at least two charge pumping currents $I_{cp}$,
   l) determining the calculated channel length $L_{calc}$ corresponding to each of the selected charge pumping currents $I_{cp}$ by reconstructing a spatial charge distribution estimate for each of the selected charge pumping currents $I_{cp}$, thereby creating a set of at least two datapoints ($L_{calc}$, $I_{cp}$) and
   m) determining by interpolation from the set of at least two datapoints the charge pumping current $I_{cp}$ corresponding to a channel length $L_{calc}$ substantially equal to the effective length $L_{eff}$.

4. A method according to claim 1, wherein steps d) to e) comprise:
   n) selecting on one of the charge pumping curves at least two charge pumping currents $I_{cp}$,
   o) determining the calculated channel length $L_{calc}$ corresponding to each of the selected charge pumping currents $I_{cp}$ by reconstructing a spatial charge distribution estimate for each of the selected charge pumping currents $I_{cp}$, thereby creating a set of at least two datapoints ($L_{calc}$, $I_{cp}$),
   p) determining an analytical function $L_{calc}(I_{cp})-L_{eff}=0$ from the set of at least two datapoints, and
   q) determining by solving the analytical function the charge pumping current $I_{cp}$ corresponding to a channel length $L_{calc}$ substantially equal to the effective length $L_{eff}$.

5. A method according to claim 1, wherein data from the charge pumping curves is further combined to obtain a spatial distribution of charge in traps ($N_{it}$) present at the interface between the channel and a dielectric stack which separates the charge trapping layer from the channel.

6. A method according to claim 1, further comprising the initial step of bringing the semiconductor device into a reference state by subjecting it to a light programming operation, resulting in a monotonic increase of the charge in the charge-trapping layer which results in a threshold profile $V_{th}(x)$ that monotonically varies along the channel.

7. A method according to claim 6, wherein the method is performed at least once on the semiconductor device in the reference state and at least once on the semiconductor device in a cycled state after one or more programming/erase cycles, to determine the contribution of charges remaining in the charge-trapping layer after the one or more programming/erase cycles to the threshold voltage along the channel.

8. A method according to claim 1, wherein step a) comprises applying a pulse train to a gate electrode, which is located above the charge-trapping layer opposite the channel, wherein each pulse in this pulse train has the same top-level voltage and the amplitude of the pulses increases monotonically with time by lowering the base-level voltage of the pulses.

9. A method according to claim 1, wherein step b) comprises applying a pulse train to a gate electrode, which is located above the charge-trapping layer opposite the channel, wherein each pulse in this pulse train has the same base-level voltage and the amplitude of the pulses increases monotonically with time by increasing the top-level voltage of the pulses.

10. A method according to claim 1, wherein the difference between the obtained calculated channel length $L_{calc}$ and the effective length $L_{eff}$ is less than 1%.

11. A method according to claim 1, wherein reconstructing a spatial charge distribution estimate from the charge pumping curves comprises:
r) selecting a starting point on one of the charge-pumping curves,
s) solving the equations $$(V_{\text{th\_ref}}(x) - V_{\text{fb\_ref}}(x)) - (V_{\text{th\_cyc}}(x) - V_{\text{fb\_cyc}}(x)) = \frac{q\Delta N_{it}(x)}{C},$$

and $$\int_{x_{i-1}}^{x_i} qfN_{it}(x)dx \approx ((N_{it}(x_i) - N_{it}(x_{i-1}))\left(\frac{x_i - x_{i-1}}{2}\right)$$

$$\approx I_{cp}(V_{\text{th\_cyc}}(x_i)) - I_{cp}(V_{\text{th\_cyc}}(x_{i-1}))$$

from the starting point over a selected portion of the charge-pumping curve, and
t) solving at least one of the equations $$\Delta V_{th}(x) = V_{\text{th\_ref}}(x) - V_{\text{th\_cyc}}(x)$$
$$= \frac{\Delta Q_{nt}(x) - \Delta Q_{it}(x)}{2C}$$
$$= \frac{q\Delta N_{nt}(x) - q\Delta N_{it}(x)}{2C}$$

or $$\Delta V_{fb}(x) = V_{\text{fb\_ref}}(x) - V_{\text{fb\_cyc}}(x)$$
$$= \frac{\Delta Q_{nt}(x) + \Delta Q_{it}(x)}{2C}$$
$$= \frac{q\Delta N_{nt}(x) + q\Delta N_{it}(x)}{2C},$$

wherein
$V_{th\_ref}(x)$ is the threshold voltage curve of a reference device,
$V_{fb\_ref}(x)$ is the flatband voltage curve of a reference device,
$V_{th\_cyc}(x)$ is the threshold voltage curve of the semiconductor device after at least one program/erase operation,
$V_{fb\_cyc}(x)$ is the flatband voltage curve of the semiconductor device after at least one program/erase operation,
q the absolute value of the electron charge,
$N_{it}(x)$ is the number interface traps (number/cm2),
$N_{nt}(x)$ is the number of charge carriers present in the charge-trapping layer (number/cm2),
f is the frequency of the varying-level voltage signal,
$Q_{nt}$ is the charge present in the charge-trapping layer (C/cm2),
$Q_{it}$ is the charge present in the interface traps (C/cm2),
x is a coordinate along the channel of the semiconductor device,
C is the capacitance of the dielectric stack (4) (F/cm2).

12. A method according to claim 1, wherein reconstructing a spatial charge distribution estimate from the charge pumping curves comprises:
u) selecting a starting point on one of the charge-pumping curves,
v) solving the equations $$N_{it}(x_i) = N_{it,ref} + \frac{C}{q}[(V_{\text{th\_ref}}(x) - V_{\text{fb\_ref}}(x)) - (V_{\text{th\_cyc}}(x) - V_{\text{fb\_cyc}}(x))],$$

and $$N_{it}(x_i) = \frac{2[I_{cp}(V_{\text{th\_cyc}}(x_i)) - I_{cp}(V_{\text{th\_cyc}}(x_{i-1}))]}{x_i - x_{i-1}} - N_{it}(x_{i-1})$$

from the starting point over a selected portion of the charge-pumping curve, and
w) solving at least one of the equations $$\Delta V_{th}(x) = V_{\text{th\_ref}}(x) - V_{\text{th\_cyc}}(x)$$
$$= \frac{\Delta Q_{nt}(x) - \Delta Q_{it}(x)}{2C}$$
$$= \frac{q\Delta N_{nt}(x) - q\Delta N_{it}(x)}{2C}$$

or $$\Delta V_{fb}(x) = V_{\text{fb\_ref}}(x) - V_{\text{fb\_cyc}}(x)$$
$$= \frac{\Delta Q_{nt}(x) + \Delta Q_{it}(x)}{2C}$$
$$= \frac{q\Delta N_{nt}(x) + q\Delta N_{it}(x)}{2C},$$

wherein
$V_{th\_ref}(x)$ is the threshold voltage curve of a reference device,
$V_{fb\_ref}(x)$ is the flatband voltage curve of a reference device,
$V_{th\_cyc}(x)$ is the threshold voltage curve of the semiconductor device after at least one program/erase operation,
$V_{fb\_cyc}(x)$ is the flatband voltage curve of the semiconductor device after at least one program/erase operation,
q the absolute value of the electron charge,
$\Delta N_{it}(x)$ is the number interface traps (number/cm2),
$\Delta N_{nt}(x)$ is the number of charge carriers present in the charge-trapping layer (number/cm2),
f is the frequency of the varying-level voltage signal,
$Q_{nt}$ is the charge present in the charge-trapping layer (C/cm2),
$Q_{it}$ is the charge present in the interface traps (C/cm2),
x is a coordinate along the channel of the semiconductor device,
C is the capacitance of the dielectric stack (F/cm2).

* * * * *